(12) United States Patent
Vu et al.

(10) Patent No.: US 11,557,351 B2
(45) Date of Patent: Jan. 17, 2023

(54) SENSE CIRCUIT TO SENSE TWO STATES OF A MEMORY CELL

(71) Applicant: Micron Technology, Inc., Boise, ID (US)

(72) Inventors: Luyen Tien Vu, San Jose, CA (US); Erwin E. Yu, San Jose, CA (US); Jeffrey Ming-Hung Tsai, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 87 days.

(21) Appl. No.: 17/234,240

(22) Filed: Apr. 19, 2021

(65) Prior Publication Data
US 2022/0208278 A1    Jun. 30, 2022

Related U.S. Application Data

(60) Provisional application No. 63/199,434, filed on Dec. 28, 2020.

(51) Int. Cl.
| | |
|---|---|
| *G11C 7/00* | (2006.01) |
| *G11C 16/26* | (2006.01) |
| *G11C 16/30* | (2006.01) |
| *G11C 16/04* | (2006.01) |
| *G11C 11/56* | (2006.01) |

(52) U.S. Cl.
CPC .......... *G11C 16/26* (2013.01); *G11C 16/0483* (2013.01); *G11C 16/30* (2013.01); *G11C 11/5671* (2013.01)

(58) Field of Classification Search
CPC .... G11C 7/02; G11C 7/18; G11C 7/06; G11C 11/4091; G11C 11/4097
USPC .................................................. 365/206, 207
See application file for complete search history.

(56) References Cited

U.S. PATENT DOCUMENTS

| | | | |
|---|---|---|---|
| 2011/0316499 A1* | 12/2011 | Singnurkar | G05F 1/575 323/268 |
| 2020/0280311 A1* | 9/2020 | Morini | H03K 17/165 |

* cited by examiner

*Primary Examiner* — Son T Dinh
(74) *Attorney, Agent, or Firm* — Lowenstein Sandler LLP

(57) ABSTRACT

A device includes a memory array and a sense circuit coupled with the memory array. The sense circuit includes a sense node coupled with a data line of the memory array. A first sensing path includes a first transistor having a first gate coupled with the sense node. A second sensing path includes a second transistor having a second gate coupled with the sense node. A first threshold voltage of the first transistors differs from a second threshold voltage of the second transistor by a threshold voltage gap.

20 Claims, 15 Drawing Sheets

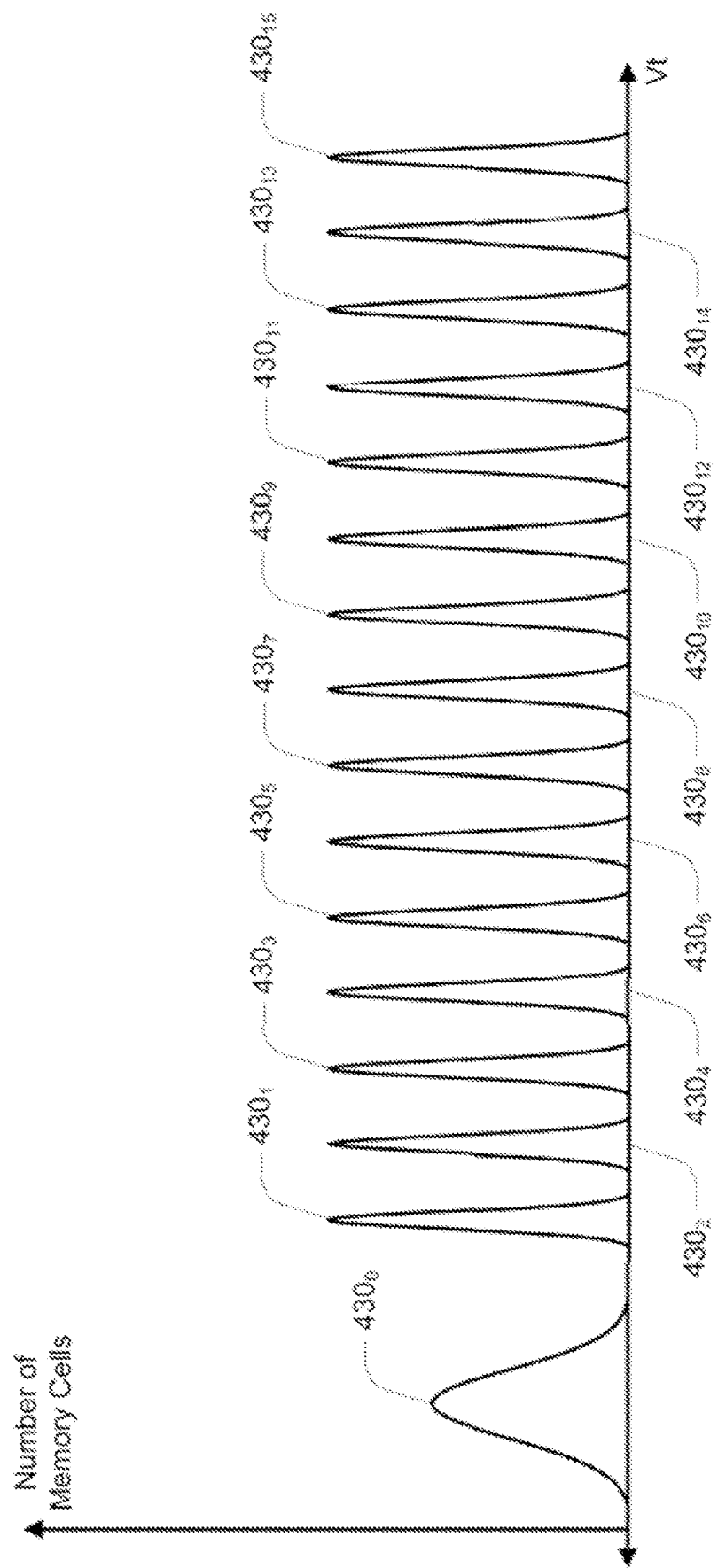

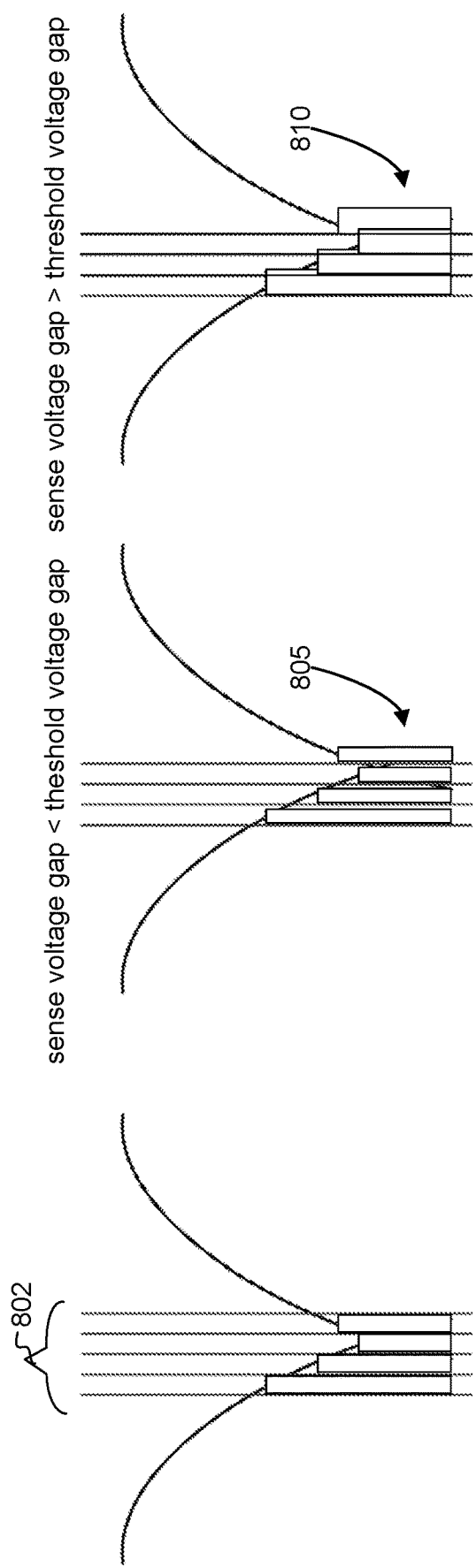

SENSE CIRCUIT TO SENSE TWO STATES OF A MEMORY CELL

REFERENCE TO RELATED APPLICATION

This application claims the benefit of U.S. Provisional Patent Application No. 63/199,434, filed Dec. 28, 2020, the entirety of which is incorporated herein by reference.

TECHNICAL FIELD

Embodiments of the disclosure are generally related to memory sub-systems, and more specifically, relate to a sense circuit to concurrently sense two states of a memory cell.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The present disclosure will be understood more fully from the detailed description given below and from the accompanying drawings of some embodiments of the disclosure.

FIG. 4 is a conceptual depiction of threshold voltage distributions of multiple memory cells of a memory array according to an embodiment.

FIG. 8A is a graph illustrating a set of histograms obtained from five equidistant boost voltages applied to a sense node of a single-path sense circuit according to an embodiment.

FIG. 8B is a graph illustrating a set of histograms obtained from four different boost voltages using two different sensing paths of a sense circuit where a sense voltage gap is smaller than a threshold voltage gap according to an embodiment.

FIG. 8C is a graph illustrating a set of histograms obtained from four different boost voltages using two different sensing paths of a sense circuit where a sense voltage gap is larger than a threshold voltage gap according to an embodiment.

DETAILED DESCRIPTION

Figure 1A:
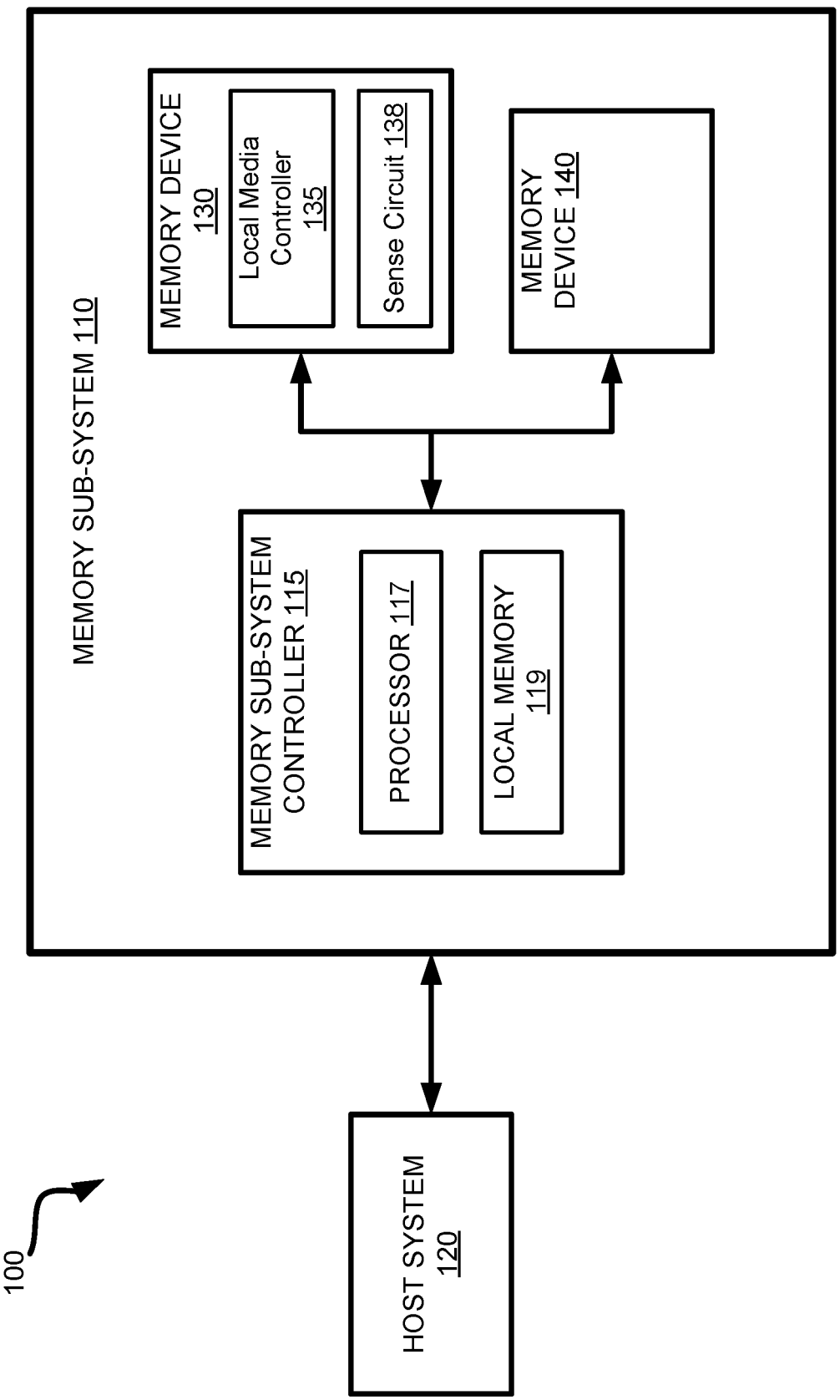
FIG. 1A illustrates an example computing system that includes a memory sub-system in accordance with some embodiments.

Embodiments of the present disclosure are directed to a sense circuit adapted to concurrently sense two states of a memory cell. Various access operations can be performed on the memory cells. For example, data can be written to, read from, and erased from memory cells. Memory cells can be grouped into a write unit, such as a page. For some types of memory devices, a page is the smallest write unit. A wordline can have multiple pages on the same wordline grouped as sub-blocks. One sub-block is typically accessed at any given time. Although each sub-block has its own set of select gates coupled to bitlines, the sub-blocks share a common page buffer, also referred to herein as a "sense circuit."

In certain memory systems, charge loss occurs within memory cells in which a threshold voltage (Vt) of a memory cell can shift away from an originally-programmed level, making it more difficult to determine a logical state of the memory cell, particularly as time passes and the memory cells loses more charge. More specifically, a read window bandwidth between adjacent threshold voltage distributions that encode two different logical states can narrow, making it more difficult to find a local minima between the adjacent threshold voltage distributions where a transition between the logical states can be determined.

In these memory systems, a local media controller can cause a sense circuit within a page buffer used to access the memory cell(s) to perform a parallel auto-read calibration on a memory cell using a number of boost regulators. The boost regulators can provide different boost voltages to capacitively change the voltage at a sense node of the sense circuit that is coupled to a data line. A first boost voltage can bring the sense node to an initial voltage, and each subsequent boost voltage can slightly vary the voltage at the sense node. In certain memory systems, two separate sensing operations use a total of five different boost voltage levels to sense (e.g., attempt to read or verify) the memory cell via the data line. The sensed voltage levels along the adjacent threshold voltage distributions of the cell can result in histogram data, in this case four histograms that probe threshold voltage levels between the adjacent threshold voltage distributions. By analyzing these histograms, the local media controller can determine the local minima. The sense circuit can then use the voltage level associated with the local minima as a boost voltage level for reading data out of the memory cell, e.g., distinguishing between the two logical states. Performing the sensing operations in this manner, however, is a slow process (e.g., hundreds of nanoseconds for each boost to the sense node), creating significant delay for performing a read operation of the memory cell.

Aspects of the present disclosure address the above and other deficiencies through elimination of at least one boost to the sense node while still generating the number of histograms (e.g., four histograms) that are used to determine the local minima. More specifically, the sense circuit of the page buffer that contains the sense node can be adapted with two sensing paths instead of a single sensing path. The second sensing path can be designed with a built-in difference in a trigger point for sensing a particular voltage, where the built-in difference is approximately equivalent to a threshold voltage gap that would have been provided by a separate boost to the sense node. In this way, the addition of a small amount of hardware mimics performance of a separate boost and thus saves the time that would otherwise be consumed by applying that separate boost.

In one embodiment, a first sensing path of the two sensing paths includes a first transistor that has a first gate coupled with the sense node. The second sensing path includes a second transistor having a second gate coupled with the sense node. A first threshold voltage of the first transistors differs from a second threshold voltage of the second transistor by a threshold voltage gap. Each of the first and second transistors can be directly coupled to ground and be either an n-channel metal oxide semiconductor (NMOS) transistor or a p-channel metal oxide semiconductor (PMOS) transistor. The channel of the second transistor can be implanted with a dose that differs from that of the first transistor such as to provide the threshold voltage gap, for example.

In another embodiment, the second sensing path includes a second transistor that has a second gate coupled with the sense node, where the second transistor is also defined by the same inner threshold voltage (e.g., trigger gate-source voltage, or Vgs of the transistors). In this embodiment, however, a voltage source is coupled to a source of the second transistor to change a trip point of the second transistor by a threshold voltage gap. In one embodiment, the voltage source is source-ground regulator coupled between the source of the second transistor and ground to variably regulate the voltage bias, and thus the trip point, at the source of the second transistor. The trip point is the point at which the Vgs equals the threshold voltage of the transistor and turns the transistor on.

Therefore, advantages of the systems and methods implemented in accordance with some embodiments of the present disclosure include, but are not limited to, the ability to determine two separate states of a memory cell via sensing, at a sense node of a sense circuit, by two separate sensing paths one of which senses at a slightly different voltage. Reducing the sensing operations by even a single voltage boost can significantly reduce the read time to complete a read operation or a program verify operation. Further, as will be discussed, the present dual-path sensing design can effectively increase a voltage sensing range, providing additional histogram data range in sensed voltage states of memory cells. Other advantages will be apparent to those skilled in the art of scanning of programmed wordlines within a memory sub-system discussed hereinafter.

FIG. 1A illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such media or memory devices. The memory sub-system 110 can be a storage device, a memory module, or a hybrid of a storage device and memory module.

The memory device 130 can be a non-volatile memory device. One example of non-volatile memory devices is a negative-and (NAND) memory device. A non-volatile memory device is a package of one or more dice. Each die can include one or more planes. Planes can be groups into logic units (LUN). For some types of non-volatile memory devices (e.g., NAND devices), each plane consists of a set of physical blocks. Each block consists of a set of pages. Each page include a set of memory cells ("cells"). A cell is an electronic circuit that stores information. Depending on the cell type, a cell can store one or more bits of binary information, and has various logic states that correlate to the number of bits being stored. The logic states can be represented by binary values, such as "0" and "1", or combinations of such values.

The memory device 130 can be made up of bits arranged in a two-dimensional or three-dimensional grid, also referred to as a memory array. Memory cells are etched onto a silicon wafer in an array of columns (also hereinafter referred to as bitlines) and rows (also hereinafter referred to as wordlines). A wordline can refer to one or more rows of memory cells of a memory device that are used with one or more bitlines to generate the address of each of the memory cells. The intersection of a bitline and wordline constitutes the address of the memory cell.

A memory sub-system 110 can be a storage device, a memory module, or a combination of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory modules (NVDIMMs).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to multiple memory sub-systems 110 of different types. FIG. 1A illustrates one example of a host system 120 coupled to one memory sub-system 110. The host system 120 can provide data to be stored at the memory sub-system 110 and can request data to be retrieved from the memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the physical host interface (e.g., PCIe bus). The physical host interface can provide an interface for passing control, address, data, and other signals between the memory sub-system 110 and the host system 120. FIG. 1A illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include a negative-and (NAND) type flash memory and write-in-place memory, such as a three-dimensional cross-point ("3D cross-point") memory device, which is a cross-point array of non-volatile memory cells. A cross-point array of non-volatile memory cells can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell. Other types of memory cells, such as multi-level cells (MLCs), triple level cells (TLCs), quad-level cells (QLCs), and penta-level cells (PLCs) can store multiple bits per cell. In some embodiments, each of the memory devices 130 can include one or more arrays of memory cells such as SLCs, MLCs, TLCs, QLCs, PLCs or any combination of such. In some embodiments, a particular memory device can include an SLC portion, and an MLC portion, a TLC portion, a QLC portion, or a PLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as a 3D cross-point array of non-volatile memory cells and NAND type flash memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, or electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processing device, which includes one or more processors (e.g., processor 117), configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1A has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical address (e.g., a logical block address (LBA), namespace) and a physical address (e.g., physical block address) that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage a memory device 130 (e.g., perform media management operations on the memory device 130). In some embodiments, memory sub-system 110 is a managed memory device, which is a raw memory device 130 having control logic (e.g., local media controller 135) on the die and a controller (e.g., memory sub-system controller 115) for media management within the same memory device package. An example of a managed memory device is a managed NAND (MNAND) device.

In some embodiments, the memory device 130 includes a sense circuit 138, which can be a page buffer, for example. The sense circuit 138 can be designed with two sensing paths to concurrently sense two states of a sense node, e.g., and thus a memory cell of a memory array coupled to the sense node, for purposes of obtaining histogram data. The local media controller 135 can analyze the histogram data to determine a local minima between two adjacent threshold voltage distributions within the memory cell. The sense circuit 138 can then use the voltage level associated with the local minima as a boost voltage level for reading data out of the memory cell.

Figure 1B:
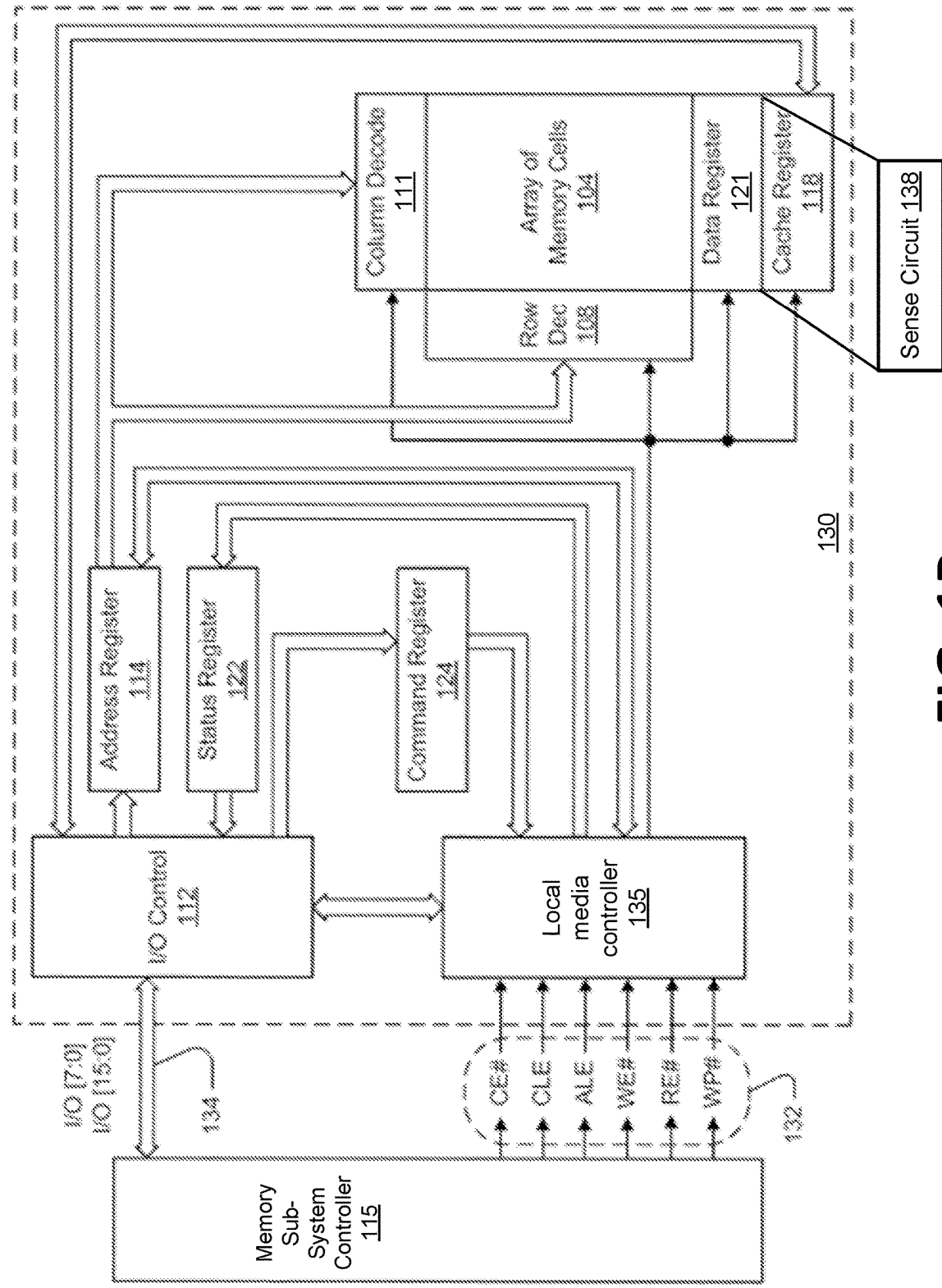
FIG. 1B is a block diagram of a memory device in communication with a memory sub-system controller of a memory sub-system according to an embodiment.

FIG. 1B is a simplified block diagram of a first apparatus, in the form of a memory device 130, in communication with a second apparatus, in the form of a memory sub-system controller 115 of a memory sub-system (e.g., the memory sub-system 110 of FIG. 1A), according to an embodiment. Some examples of electronic systems include personal computers, personal digital assistants (PDAs), digital cameras, digital media players, digital recorders, games, appliances, vehicles, wireless devices, mobile telephones and the like. The memory sub-system controller 115 (e.g., a controller external to the memory device 130), can be a memory controller or other external host device.

The memory device 130 includes an array of memory cells 104 logically arranged in rows and columns. Memory cells of a logical row are typically connected to the same access line (e.g., a word line) while memory cells of a logical column are typically selectively connected to the same data line (e.g., a bit line). A single access line can be associated with more than one logical row of memory cells and a single data line can be associated with more than one logical column. Memory cells (not shown in FIG. 1B) of at least a portion of the array of memory cells 104 are capable of being programmed to one of at least two target data states.

Row decode circuitry 108 and column decode circuitry 111 are provided to decode address signals. Address signals are received and decoded to access the array of memory cells 104. The memory device 130 also includes input/output (I/O) control circuitry 112 to manage input of commands, addresses and data to the memory device 130 as well as output of data and status information from the memory device 130. An address register 114 is in communication with the I/O control circuitry 112 and row decode circuitry 108 and column decode circuitry 111 to latch the address signals prior to decoding. A command register 124 is in communication with the I/O control circuitry 112 and local media controller 135 to latch incoming commands.

A controller (e.g., the local media controller 135 internal to the memory device 130) controls access to the array of memory cells 104 in response to the commands and generates status information for the external memory sub-system controller 115, i.e., the local media controller 135 is configured to perform access operations (e.g., read operations, programming operations and/or erase operations) on the array of memory cells 104. The local media controller 135 is in communication with row decode circuitry 108 and column decode circuitry 111 to control the row decode circuitry 108 and column decode circuitry 111 in response to the addresses.

The local media controller 135 is also in communication with a cache register 118 and a data register 121. The cache register 118 latches data, either incoming or outgoing, as directed by the local media controller 135 to temporarily store data while the array of memory cells 104 is busy writing or reading, respectively, other data. During a program operation (e.g., write operation), data can be passed from the cache register 118 to the data register 121 for transfer to the array of memory cells 104; then new data can be latched in the cache register 118 from the I/O control circuitry 112. During a read operation, data can be passed from the cache register 118 to the I/O control circuitry 112 for output to the memory sub-system controller 115; then new data can be passed from the data register 121 to the cache register 118. The cache register 118 and/or the data register 121 can form (e.g., can form a portion of) a page buffer of the memory device 130. A page buffer can further include sensing devices such as the sense circuit 138 (FIG. 1A), also referred to as a sense amplifier, to sense a data state of a memory cell of the array of memory cells 104, e.g., by sensing a state of a data line connected to that memory cell. A status register 122 can be in communication with I/O control circuitry 112 and the local memory controller 135 to latch the status information for output to the memory sub-system controller 115.

The memory device 130 receives control signals at the memory sub-system controller 115 from the local media controller 135 over a control link 132. For example, the control signals can include a chip enable signal CE #, a command latch enable signal CLE, an address latch enable signal ALE, a write enable signal WE #, a read enable signal RE #, and a write protect signal WP #. Additional or alternative control signals (not shown) can be further received over control link 132 depending upon the nature of the memory device 130. In one embodiment, memory device 130 receives command signals (which represent commands), address signals (which represent addresses), and data signals (which represent data) from the memory sub-system controller 115 over a multiplexed input/output (I/O) bus 134 and outputs data to the memory sub-system controller 115 over I/O bus 134.

For example, the commands can be received over input/output (I/O) pins [7:0] of I/O bus 134 at I/O control circuitry 112 and can then be written into a command register 124. The addresses can be received over input/output (I/O) pins [7:0] of I/O bus 134 at I/O control circuitry 112 and can then be written into address register 114. The data can be received over input/output (I/O) pins [7:0] for an 8-bit device or input/output (I/O) pins [15:0] for a 16-bit device at I/O control circuitry 112 and then can be written into cache register 118. The data can be subsequently written into data register 121 for programming the array of memory cells 104.

In an embodiment, cache register 118 can be omitted, and the data can be written directly into data register 121. Data can also be output over input/output (I/O) pins [7:0] for an 8-bit device or input/output (I/O) pins [15:0] for a 16-bit device. Although reference can be made to I/O pins, they can include any conductive node providing for electrical connection to the memory device 130 by an external device (e.g., the memory sub-system controller 115), such as conductive pads or conductive bumps as are commonly used.

It will be appreciated by those skilled in the art that additional circuitry and signals can be provided, and that the memory device 130 of FIG. 1B has been simplified. It should be recognized that the functionality of the various block components described with reference to FIG. 1B may not necessarily be segregated to distinct components or component portions of an integrated circuit device. For example, a single component or component portion of an integrated circuit device could be adapted to perform the functionality of more than one block component of FIG. 1B. Alternatively, one or more components or component portions of an integrated circuit device could be combined to perform the functionality of a single block component of FIG. 1B. Additionally, while specific I/O pins are described in accordance with popular conventions for receipt and output of the various signals, it is noted that other combinations or numbers of I/O pins (or other I/O node structures) can be used in the various embodiments.

Figure 2A:
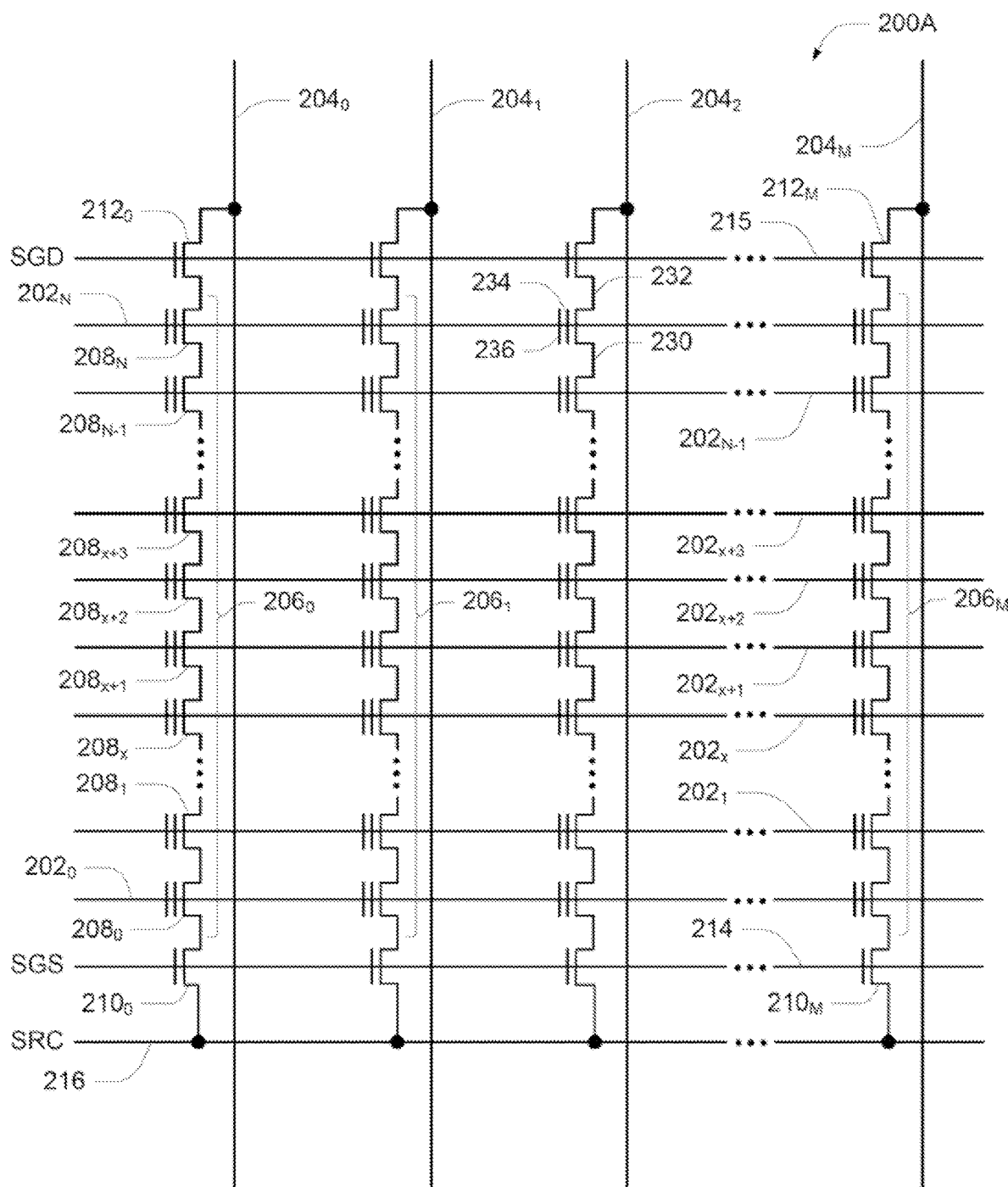
FIG. 2A-2C are schematics of portions of an array of memory cells as could be used in a memory of the type described with reference to FIG. 1B according to an embodiment.
Figure 2B:
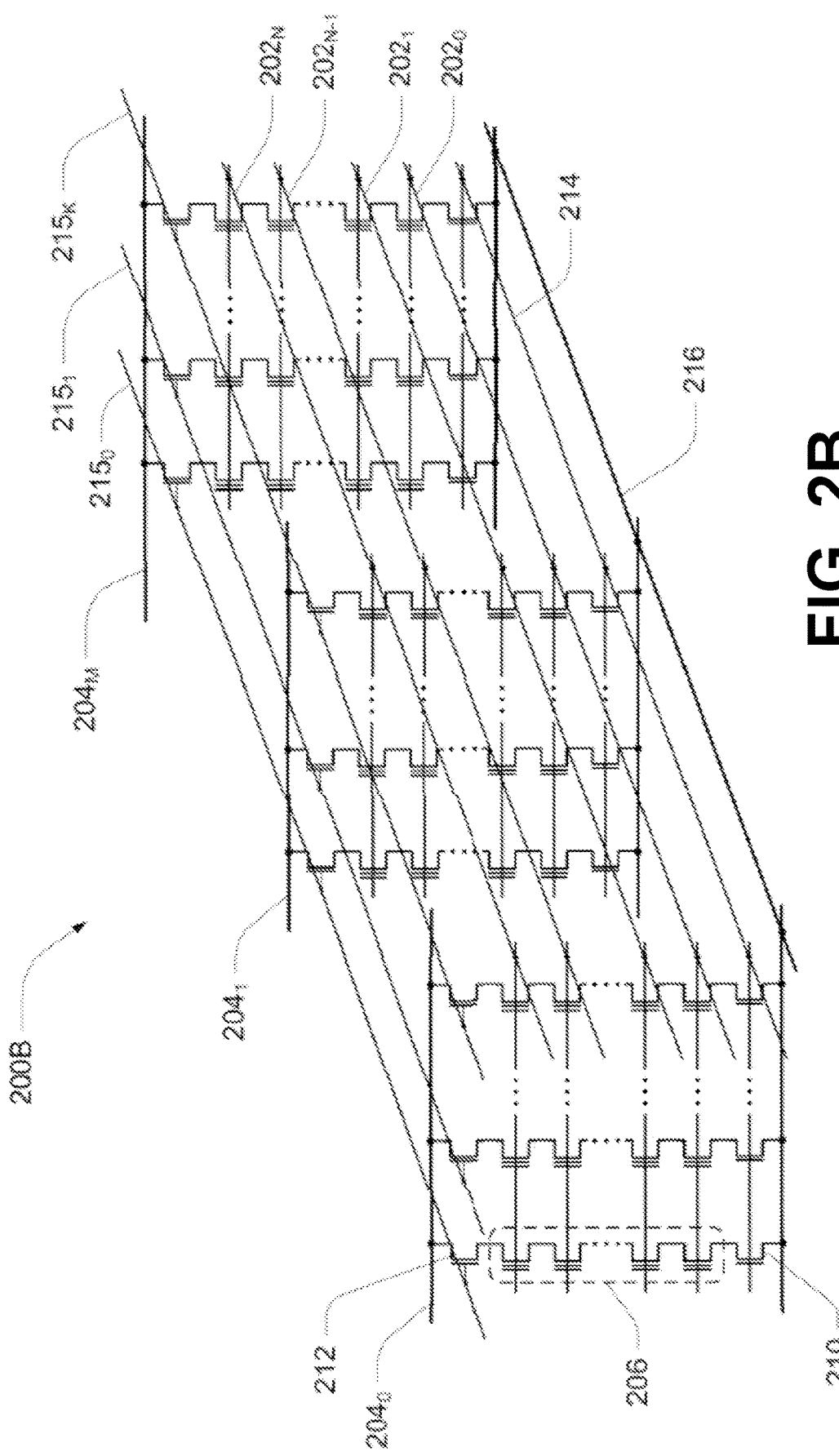
Figure 2C:
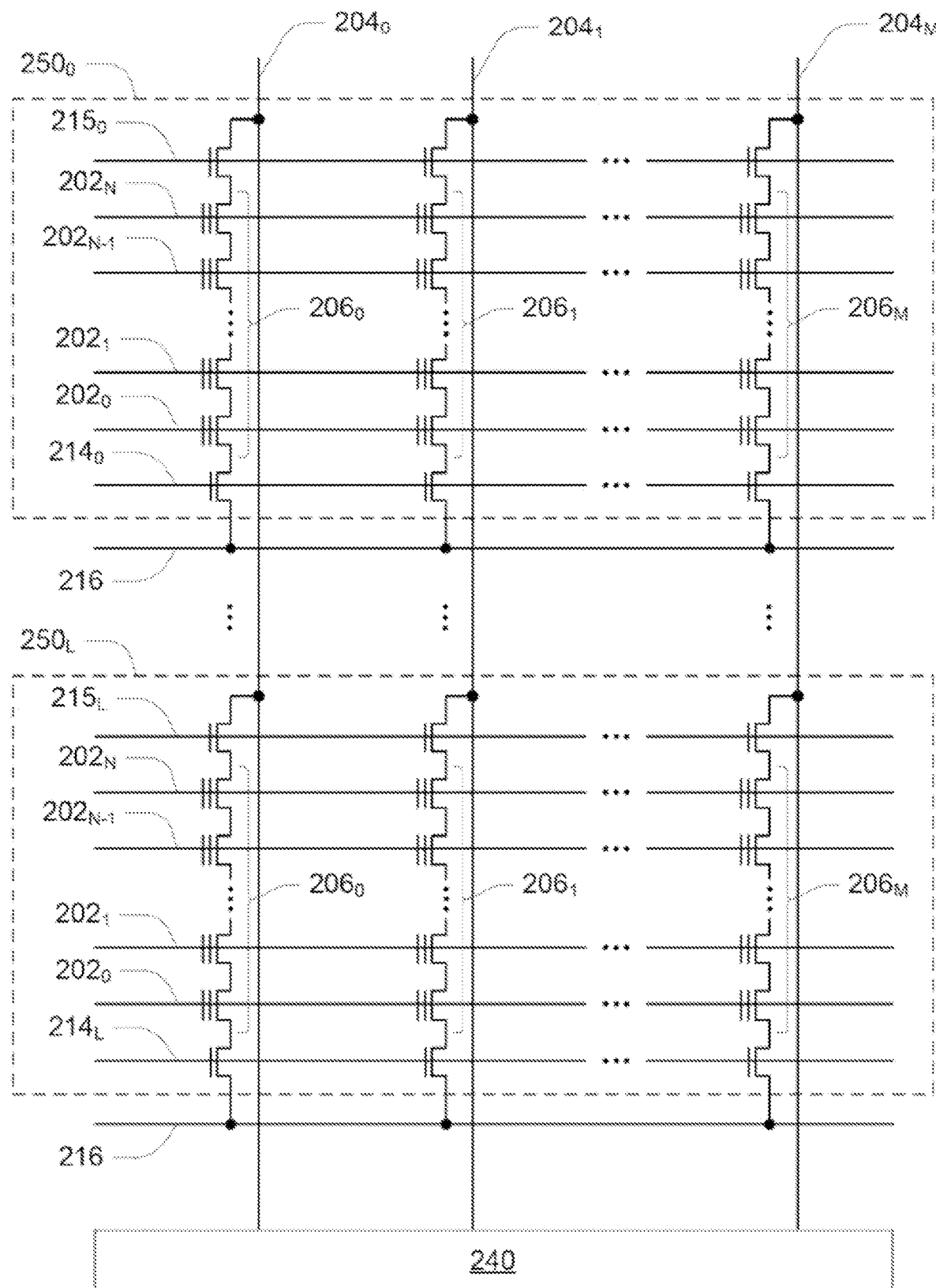

FIG. 2A-2C are schematics of portions of an array of memory cells 200A, such as a NAND memory array, as could be used in a memory of the type described with reference to FIG. 1B according to an embodiment, e.g., as a portion of the array of memory cells 104. Memory array 200A includes access lines, such as word lines $202_0$ to $202_N$, and data lines, such as bit lines $204_0$ to $204_M$. The word lines 202 can be connected to global access lines (e.g., global word lines), not shown in FIG. 2A, in a many-to-one relationship. For some embodiments, memory array 200A can be formed over a semiconductor that, for example, can be conductively doped to have a conductivity type, such as a p-type conductivity, e.g., to form a p-well, or an n-type conductivity, e.g., to form an n-well.

Memory array 200A can be arranged in rows (each corresponding to a word line 202) and columns (each corresponding to a bit line 204). Each column can include a string of series-connected memory cells (e.g., non-volatile memory cells), such as one of NAND strings $206_0$ to $206_M$. Each NAND string 206 can be connected (e.g., selectively connected) to a common source (SRC) 216 and can include memory cells $208_0$ to $208_N$. The memory cells 208 can represent non-volatile memory cells for storage of data. The memory cells 208 of each NAND string 206 can be connected in series between a select gate 210 (e.g., a field-effect transistor), such as one of the select gates $210_0$ to $210_M$ (e.g., that can be source select transistors, commonly referred to as select gate source), and a select gate 212 (e.g., a field-effect transistor), such as one of the select gates $212_0$ to $212_M$ (e.g., that can be drain select transistors, commonly referred to as select gate drain). Select gates $210_0$ to $210_M$ can be commonly connected to a select line 214, such as a source select line (SGS), and select gates $212_0$ to $212_M$ can be commonly connected to a select line 215, such as a drain select line (SGD). Although depicted as traditional field-effect transistors, the select gates 210 and 212 can utilize a structure similar to (e.g., the same as) the memory cells 208. The select gates 210 and 212 can represent a number of select gates connected in series, with each select gate in series configured to receive a same or independent control signal.

A source of each select gate 210 can be connected to common source 216. The drain of each select gate 210 can be connected to a memory cell $208_0$ of the corresponding NAND string 206. For example, the drain of select gate $210_0$ can be connected to memory cell $208_0$ of the corresponding NAND string $206_0$. Therefore, each select gate 210 can be configured to selectively connect a corresponding NAND string 206 to the common source 216. A control gate of each select gate 210 can be connected to the select line 214.

The drain of each select gate 212 can be connected to the bit line 204 for the corresponding NAND string 206. For example, the drain of select gate $212_0$ can be connected to the bit line $204_0$ for the corresponding NAND string $206_0$. The source of each select gate 212 can be connected to a memory cell $208_N$ of the corresponding NAND string 206. For example, the source of select gate $212_0$ can be connected to memory cell $208_N$ of the corresponding NAND string $206_0$. Therefore, each select gate 212 can be configured to selectively connect a corresponding NAND string 206 to the corresponding bit line 204. A control gate of each select gate 212 can be connected to select line 215.

The memory array in FIG. 2A can be a quasi-two-dimensional memory array and can have a generally planar structure, e.g., where the common source 216, NAND strings 206 and bit lines 204 extend in substantially parallel planes. Alternatively, the memory array 200A in FIG. 2A can be a three-dimensional memory array, e.g., where NAND strings 206 can extend substantially perpendicular to a plane containing the common source 216 and to a plane containing the bit lines 204 that can be substantially parallel to the plane containing the common source 216.

Typical construction of memory cells 208 includes a data-storage structure 234 (e.g., a floating gate, charge trap, and the like) that can determine a data state of the memory cell (e.g., through changes in threshold voltage), and a control gate 236, as shown in FIG. 2A. The data-storage structure 234 can include both conductive and dielectric structures while the control gate 236 is generally formed of one or more conductive materials. In some cases, memory cells 208 can further have a defined source/drain (e.g., source) 230 and a defined source/drain (e.g., drain) 232. The memory cells 208 have their control gates 236 connected to (and in some cases form) a word line 202.

A column of the memory cells 208 can be a NAND string 206 or a number of NAND strings 206 selectively connected to a given bit line 204. A row of the memory cells 208 can be memory cells 208 commonly connected to a given word line 202. A row of memory cells 208 can, but need not, include all the memory cells 208 commonly connected to a given word line 202. Rows of the memory cells 208 can often be divided into one or more groups of physical pages of memory cells 208, and physical pages of the memory cells 208 often include every other memory cell 208 commonly connected to a given word line 202. For example, the memory cells 208 commonly connected to word line $202_N$ and selectively connected to even bit lines 204 (e.g., bit lines $204_0$, $204_2$, $204_4$, etc.) can be one physical page of the memory cells 208 (e.g., even memory cells) while memory cells 208 commonly connected to word line $202_N$ and selectively connected to odd bit lines 204 (e.g., bit lines $204_1$, $204_3$, $204_5$, etc.) can be another physical page of the memory cells 208 (e.g., odd memory cells).

Although bit lines $204_3$-$204_5$ are not explicitly depicted in FIG. 2A, it is apparent from the figure that the bit lines 204 of the array of memory cells 200A can be numbered consecutively from bit line $204_0$ to bit line $204_M$. Other groupings of the memory cells 208 commonly connected to a given word line 202 can also define a physical page of memory cells 208. For certain memory devices, all memory cells commonly connected to a given word line can be deemed a physical page of memory cells. The portion of a physical page of memory cells (which, in some embodiments, could still be the entire row) that is read during a single read operation or programmed during a single programming operation (e.g., an upper or lower page of memory cells) can be deemed a logical page of memory cells. A block of memory cells can include those memory cells that are configured to be erased together, such as all memory cells connected to word lines $202_0$-$202_N$ (e.g., all NAND strings 206 sharing common word lines 202). Unless expressly distinguished, a reference to a page of memory cells herein refers to the memory cells of a logical page of memory cells. Although the example of FIG. 2A is discussed in conjunction with NAND flash, the embodiments and concepts described herein are not limited to a particular array architecture or structure, and can include other structures (e.g., SONOS, phase change, ferroelectric, etc.) and other architectures (e.g., AND arrays, NOR arrays, etc.).

FIG. 2B is another schematic of a portion of an array of memory cells 200B as could be used in a memory of the type described with reference to FIG. 1B, e.g., as a portion of the array of memory cells 104. Like numbered elements in FIG. 2B correspond to the description as provided with respect to FIG. 2A. FIG. 2B provides additional detail of one example of a three-dimensional NAND memory array structure. The three-dimensional NAND memory array 200B can incorporate vertical structures which can include semiconductor pillars where a portion of a pillar can act as a channel region of the memory cells of NAND strings 206. The NAND strings 206 can be each selectively connected to a bit line $204_0$-$204_M$ by a select transistor 212 (e.g., that can be drain select transistors, commonly referred to as select gate drain) and to a common source 216 by a select transistor 210 (e.g., that can be source select transistors, commonly referred to as select gate source). Multiple NAND strings 206 can be selectively connected to the same bit line 204. Subsets of NAND strings 206 can be connected to their respective bit lines 204 by biasing the select lines $215_0$-$215_K$ to selectively activate particular select transistors 212 each between a NAND string 206 and a bit line 204. The select gate transistors 210 can be activated by biasing the select line 214. Each word line 202 can be connected to multiple rows of memory cells of the memory array 200B. Rows of memory cells that are commonly connected to each other by a particular word line 202 can collectively be referred to as tiers.

FIG. 2C is a further schematic of a portion of an array of memory cells 200C as could be used in a memory of the type described with reference to FIG. 1B, e.g., as a portion of the array of memory cells 104. Like numbered elements in FIG. 2C correspond to the description as provided with respect to FIG. 2A. The array of memory cells 200C can include strings of series-connected memory cells (e.g., NAND strings) 206, access (e.g., word) lines 202, data (e.g., bit) lines 204, select lines 214 (e.g., source select lines), select lines 215 (e.g., drain select lines) and a source 216 as depicted in FIG. 2A. A portion of the array of memory cells 200A can be a portion of the array of memory cells 200C, for example.

FIG. 2C depicts groupings of NAND strings 206 into blocks of memory cells 250, e.g., blocks of memory cells $250_0$-$250_L$. Blocks of memory cells 250 can be groupings of memory cells 208 that can be erased together in a single erase operation, sometimes referred to as erase blocks. Each block of memory cells 250 can represent those NAND strings 206 commonly associated with a single select line 215, e.g., select line $215_0$. The source 216 for the block of memory cells $250_0$ can be a same source as the source 216 for the block of memory cells $250_L$. For example, each block of memory cells $250_0$-$250_L$ can be commonly selectively connected to the source 216. Access lines 202 and select lines 214 and 215 of one block of memory cells 250 can have no direct connection to access lines 202 and select lines 214 and 215, respectively, of any other block of memory cells of the blocks of memory cells $250_0$-$250_L$.

The data lines $204_0$-$204_M$ can be connected (e.g., selectively connected) to a buffer portion 240, which can be a portion of a page buffer of the memory. The buffer portion 240 can correspond to a memory plane (e.g., the set of blocks of memory cells $250_0$-$250_L$). The buffer portion 240 can include sense circuits (such as the sense circuit 138 of FIGS. 1A-1B) for sensing data values indicated on respective data lines 204.

Figure 3:
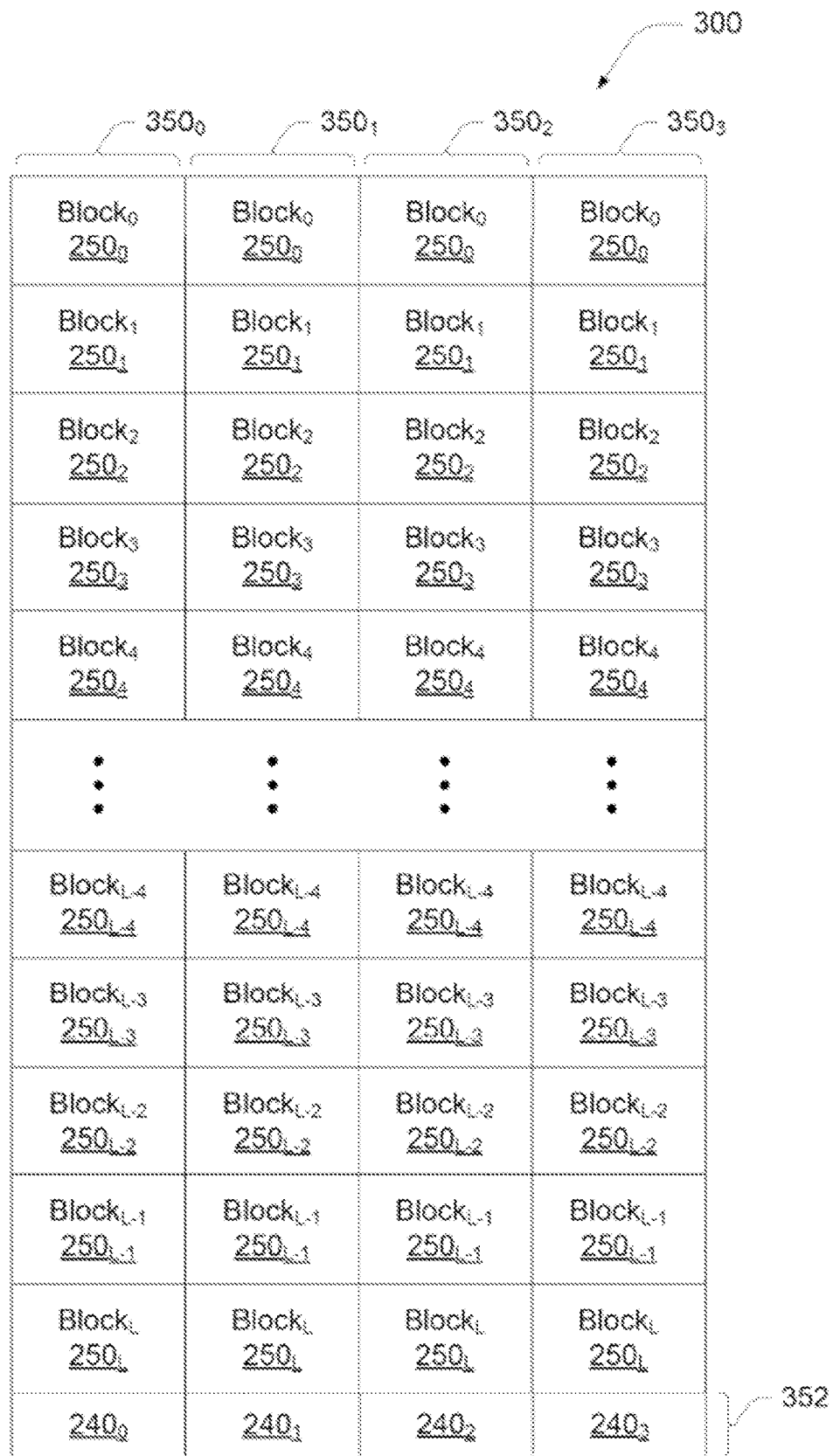
FIG. 3 is a block schematic of a portion of an array of memory cells as could be used in a memory of the type described with reference to FIG. 1B according to an embodiment.

FIG. 3 is a block schematic of a portion of an array of memory cells 300 as could be used in a memory of the type described with reference to FIG. 1B. The array of memory cells 300 is depicted as having four memory planes 350 (e.g., memory planes $350_0$-$350_3$), each in communication with a respective buffer portion 240, which can collectively form a page buffer 352. While four memory planes 350 are depicted, other numbers of memory planes 350 can be commonly in communication with a page buffer 352. Each memory plane 350 is depicted to include L+1 blocks of memory cells 250 (e.g., blocks of memory cells $250_0$-$250_L$).

FIG. 4 is a conceptual depiction of threshold voltage ranges of multiple memory cells. FIG. 4 illustrates an example of threshold voltage ranges and their distributions for a population of a sixteen-level memory cells, e.g., QLC memory cells. For example, such a memory cell can be programmed to a threshold voltage (Vt) that falls within one of sixteen different threshold voltage ranges $430_0$-$430_{15}$, each being used to represent a data state corresponding to a bit pattern of four bits. The threshold voltage range $430_0$ typically has a greater width than the remaining threshold voltage ranges $430_1$-$430_{15}$ as memory cells are generally all placed in the data state corresponding to the threshold voltage range $430_0$, then subsets of those memory cells are subsequently programmed to have threshold voltages in one of the threshold voltage ranges $430_1$-$430_{15}$. As programming operations are generally more incrementally controlled than erase operations, these threshold voltage ranges $430_1$-$430_{15}$ can tend to have tighter distributions.

The threshold voltage ranges $430_0$, $430_1$, $430_2$, $430_3$, $430_4$, $430_5$, $430_6$, $430_7$, $430_8$, $430_9$, $430_{10}$, $430_{11}$, $430_{12}$, $430_{13}$, $430_{14}$, and $430_{15}$ can each represent a respective data state, e.g., L0, L1, L2, L3, L4, L5, L6, L7, L8, L9, L10, L11, L12, L13, L14 and L15, respectively. As an example, if the threshold voltage of a memory cell is within the first of the sixteen threshold voltage ranges $430_0$, the memory cell in this case can be storing a data state L0 having a data value of logical '1111' and is typically referred to as the erased state of the memory cell. If the threshold voltage is within the second of the sixteen threshold voltage ranges $430_1$, the memory cell in this case can be storing a data state L1 having a data value of logical '0111'. If the threshold voltage is within the third of the sixteen threshold voltage ranges $430_2$, the memory cell in this case can be storing a data state L2 having a data value of logical '0011', and so on. Table 1 provides one possible correspondence between the data states and their corresponding logical data values. Other assignments of data states to logical data values are known or can be envisioned. Memory cells remaining in the lowest data state (e.g., the erased state or L0 data state), as used herein, will be deemed to be programmed to the lowest data state.

TABLE 1

| Data State | Logical Data Value |
|---|---|
| L0 | 1111 |
| L1 | 0111 |
| L2 | 0011 |
| L3 | 1011 |
| L4 | 1001 |
| L5 | 0001 |
| L6 | 0101 |
| L7 | 1101 |
| L8 | 1100 |
| L9 | 0100 |
| L10 | 0000 |
| L11 | 1000 |
| L12 | 1010 |
| L13 | 0010 |
| L14 | 0110 |
| L15 | 1110 |

Figure 5A:
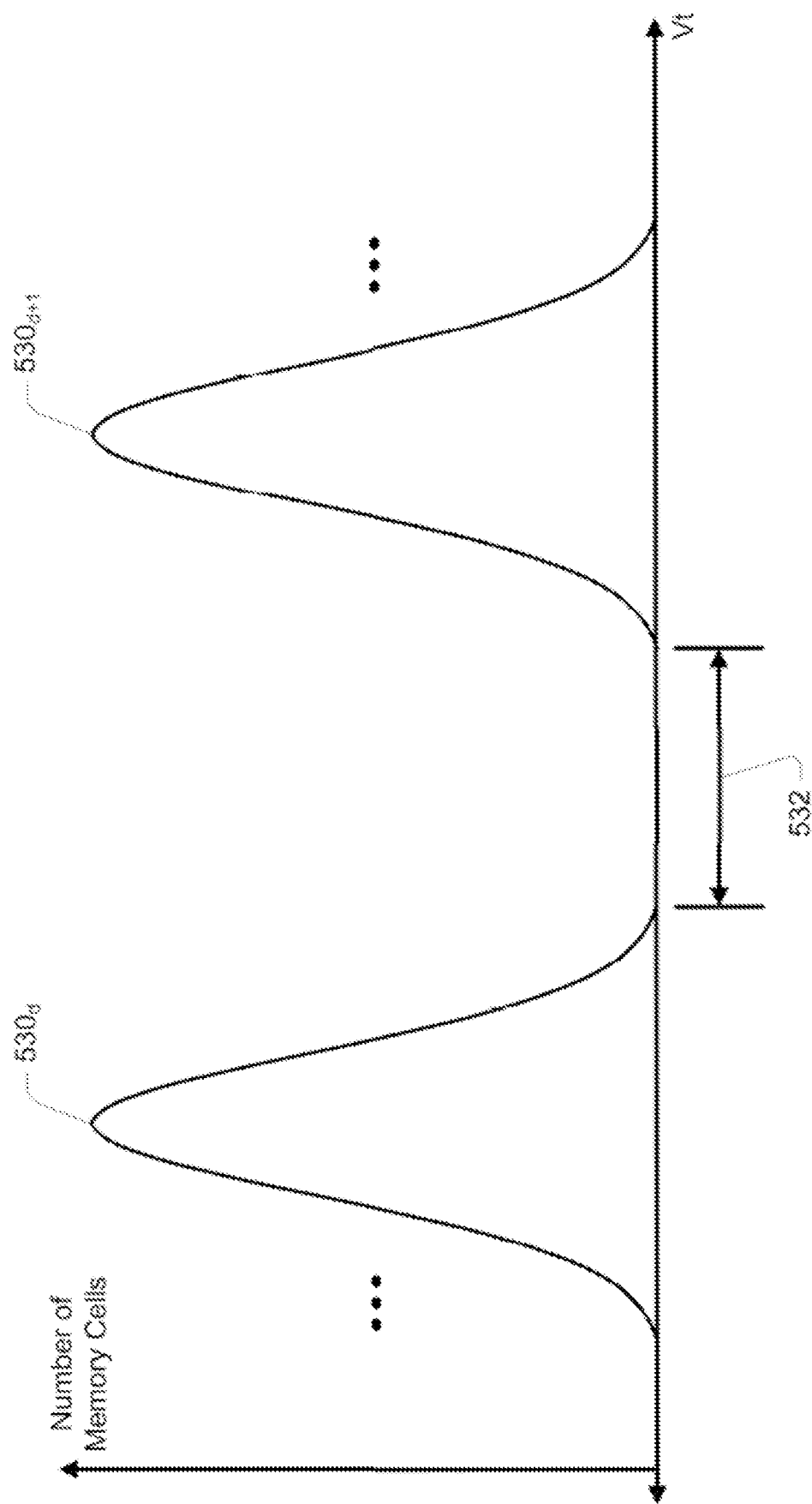
FIGS. 5A-5B are conceptual depictions of threshold voltage distributions of multiple memory cells at different stages following programming for use with various embodiments.
Figure 5B:
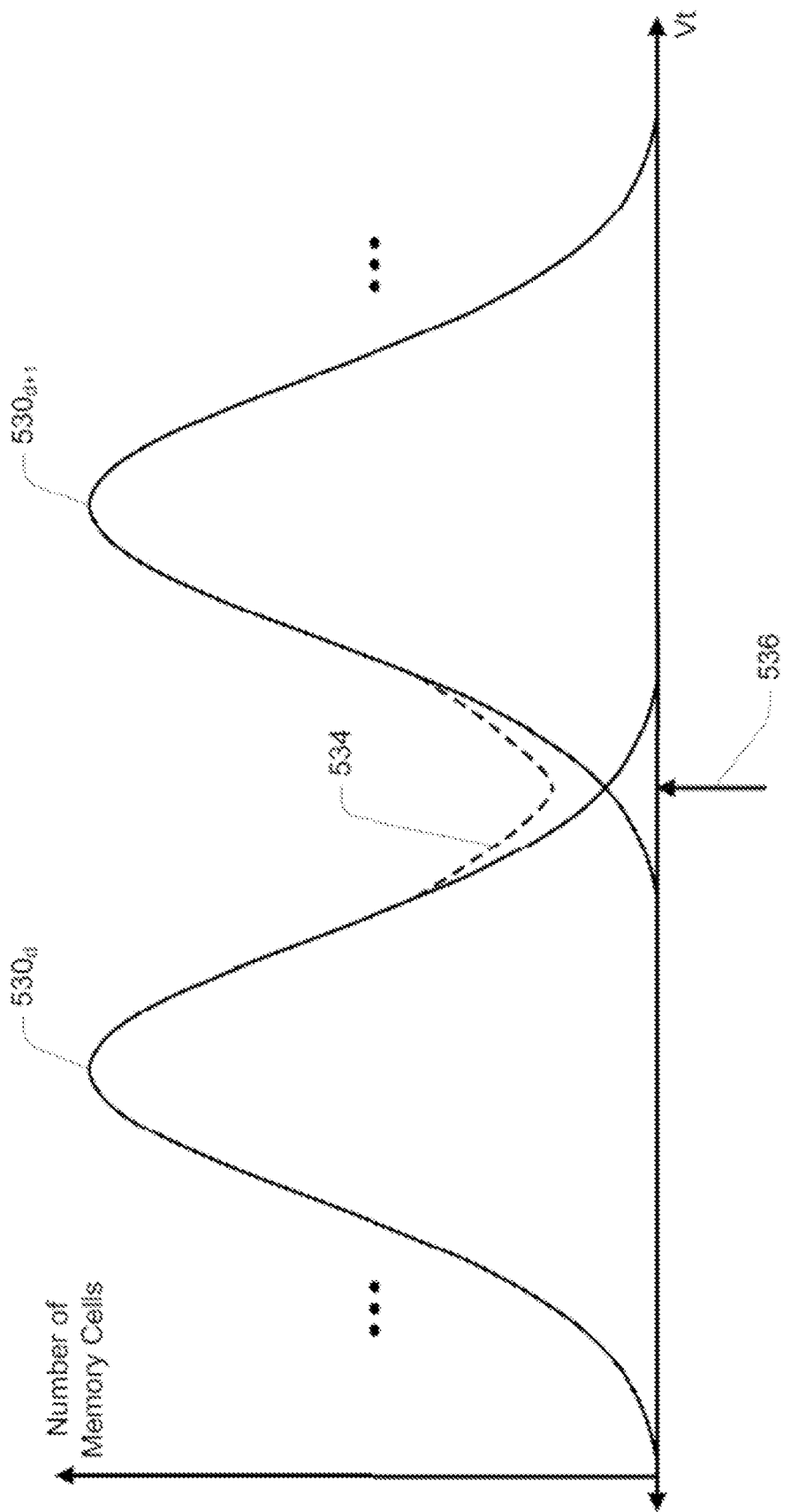

FIGS. 5A-5B are conceptual depictions of threshold voltage distributions of multiple memory cells at different stages following programming for use with embodiments. Following programming, threshold voltages of memory cells can shift due to such phenomena as quick charge loss (QCL). QCL is a de-trapping of electrons near a gate dielectric interface out to the channel region of the memory cell, and can cause a Vt shift shortly after a programming pulse. When a memory cell passes the verify operation, the programmed threshold voltage can appear to be higher due to the trapped charge in the gate dielectric. When the memory cell is read after the program operation has been completed, the memory cell can have a Vt that is lower than the Vt obtained during the program verify operation due to the charge in the gate dielectric leaking out to the channel region. Threshold voltages of memory cells can further shift due to cumulative charge loss over the age of their programmed data, e.g., a period of time between programming the data and reading the data, referred to herein as data age. Charge loss can also be affected by memory cell age. Memory cell age, as opposed to data age, is often indicated in terms of a number of program/erase cycles the memory cells have experienced. These various phenomena can result in a widening and shifting of the threshold voltage distributions over time. Various embodiments provide apparatus and methods that can facilitate a mitigation of these concerns.

FIG. 5A is a conceptual depiction of threshold voltage distributions of multiple memory cells following (e.g., immediately following) a programming operation, while FIG. 5B is a conceptual depictions of those same threshold voltage distributions at some later time following that programming operation. The threshold voltage distributions $530_d$-$530_{d+1}$ of FIG. 5A and FIG. 5B can represent some portion of the distributions for threshold voltage ranges $430_0$-$430_{15}$ of FIG. 4 at the completion of a programming operation for memory cells.

With reference to FIG. 5A, adjacent threshold voltage distributions 530 are typically separated by some margin 532 (e.g., dead space) at the completion of programming. Applying a sense voltage (e.g., read voltage) within the margin 532 to the control gates of the plurality of memory cells can be used to distinguish between the memory cells of the threshold voltage distribution $530_d$ (and any lower threshold voltage distribution) and the memory cells of the threshold voltage distribution $530_{d+1}$ (and any higher threshold voltage distribution), conceivably without error.

With reference to FIG. 5B, adjacent threshold voltage distributions can have widened, such that the threshold voltage distribution $530_d$ and the threshold voltage distribution $530_{d+1}$ can merge as represented by the curve 534 indicating a sum of the two adjacent threshold voltage distributions. The curve 534 can have a local minima 536. Where such merging of adjacent threshold voltage distributions occurs, distinguishing between memory cells intended to be in the threshold voltage distribution $530_d$ and memory cells intended to be in the threshold voltage distribution $530_{d+1}$ will generally result in some error. For example, applying a sense voltage, having a voltage level corresponding to the local minima 536, to the control gates of the plurality of memory cells can be expected to produce the least number of memory cells having a data state other than their target (e.g., intended) data state, but a certain number of errors would generally be inevitable. Applying a sense voltage higher or lower than the voltage level corresponding to the local minima 536 can be expected to produce larger numbers of errors. While applying a sense voltage having the voltage level corresponding to the local minima 536 of the curve 534 can produce the least number of errors, it can be difficult to determine at what voltage level this local minima 536 occurs.

Figure 6:
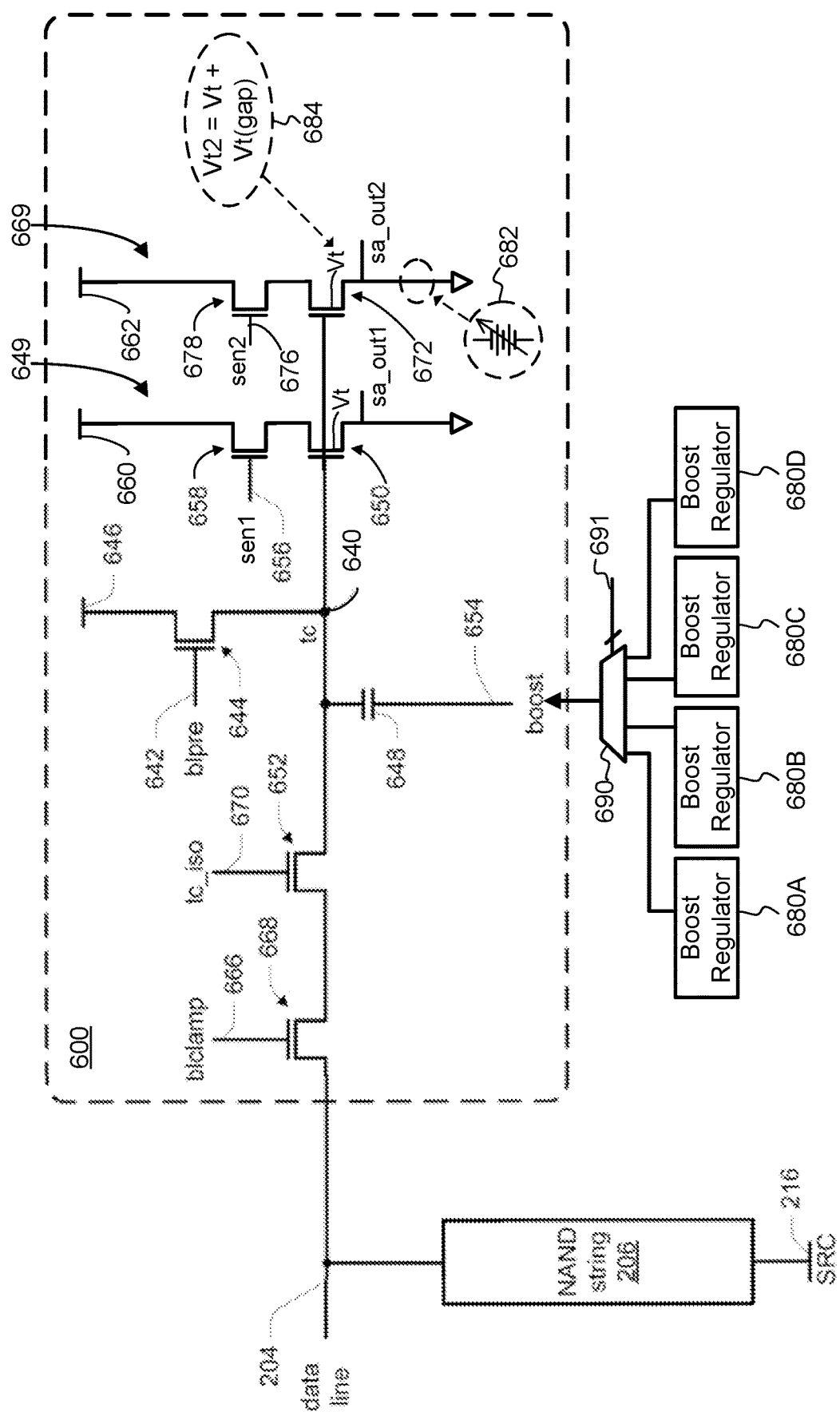
FIG. 6 is a schematic of a sense circuit capable of concurrently sensing two states of a memory cell according to some embodiments.

Sense circuits are typically utilized in memory devices to facilitate performing a sense (e.g., read and/or verify) operation on each of one or more selected (e.g., target) memory cells in the memory device. FIG. 6 is a schematic of a sense circuit 600 capable of concurrently sensing two states of a memory cell according to some embodiments. In one embodiment, the sense circuit 600 is a part of a page buffer, as previously discussed. The sense circuit 600 is illustrated connected to a particular NAND string 206 by a particular data line 204, such as illustrated in more detail in FIG. 2A, for example. Note that select gate transistors 210 and 212 selectively connecting the NAND string 206 to the source 216 and data line 204, respectively, are not shown in FIG. 6. While the discussion is directed to use of the sense circuit 600 with a NAND string 206, other memory structures and architectures are suitable for use with sense circuit 600 where a current path can be selectively created from the data line 204 to the source 216 dependent upon a data state of a memory cell selected for sensing.

As part of a sense operation, e.g., a pre-charge portion, the sense circuit 600 can pre-charge a sense node (e.g., tc node) 640 by activating a pre-charge transistor 644 (e.g., n-type field effect transistor, or nFET) by biasing (e.g., driving) the signal line 642 to a particular voltage level (e.g., a voltage level of control signal blpre) sufficient to activate the pre-charge transistor 644. Control signals of the sense circuit 600 can be provided by the internal controller (e.g., the local media controller 135) of the memory device 130. Such control signals (e.g., both voltage levels and timing) can be defined by the sense operation and are distinguished from signals generated in response to performing the sense operation (e.g., the output signal sa_out1 and sa_out2 or a voltage level generated on the sense node 640). A sense operation can be a read operation, e.g., for providing data output from the array of memory cells, or a verify operation, e.g., for verifying whether a programming pulse successfully changed a threshold voltage of a target memory cell to indicate its desired data state.

In some embodiments, the pre-charge transistor 644 is connected between a voltage node 646 and the sense node 640. The voltage node 646 can be configured to receive a supply voltage, e.g., Vcc. For some embodiments, voltage node 646 can be a variable voltage node. A capacitor 648 coupled with the sense node 640 can be representative of capacitance at the sense node 640 and at additional circuitry connected to it, e.g., the transistors 644, 650, 652, and 672. A voltage node 654 (e.g., a variable voltage node) is configured to apply a voltage level to the capacitor 648 which can induce a change in voltage level on the sense node 640, for example, to boost the sense node 640 to a higher voltage level, such as through capacitive coupling.

To provide a boost voltage to the voltage node 654, the voltage node 654 can be coupled with multiple boost regulators 680A, 680B, 680C, and 680D. A multiplexer 690 can be operatively connected between the boost regulators 680A . . . 680D and the voltage node 640, e.g., to be coupled with the capacitor 648. A selection line 691 of the multiplexer 690 can be coupled with the local media controller 135 (FIG. 1B), which can therefore control selection of one of the boost regulators 680A . . . 680D for use in pre-changing the capacitor 648 or selectively adjusting the charge of the capacitor 648 after the pre-charging in order to perform sensing operations. In various embodiments, the boost regulators 680A . . . 680D and the multiplexer 690 are either integrated within the sense circuit 600 or are a part of the page buffer of which the sense circuit 600 is a part.

Additional transistor paths of the sense circuit 600 facilitate sensing of a voltage level on the sense node 640, and in the present embodiments, provide at least two sensing paths, e.g., a first sensing path 649 and a second sensing path 669, although additional sensing paths are envisioned. In some embodiments, the first sensing path 649 includes a first select transistor 658 having a gate coupled with a first sense signal line 656, a drain coupled with a voltage node 660, and a source coupled with a first sense transistor 650 of the first sensing path 649. The first sense transistor 650 can have a gate coupled to the sense node 640, a drain coupled with the source of the first select transistor 658, and a source coupled with ground. Thus, the first sense transistor 650 is configured to be responsive to a voltage level present on the sense node 640. An output (sa_out1) of the first sensing path 649 can be taken at the source of the first sense transistor 650. The first sense signal line 656 can be configured to receive a control signal, sen1, that facilitates isolating the first sense transistor 650 from the voltage node 660, which can be configured to receive a supply voltage, e.g., Vcc. In differing embodiments, the first select transistor 658 and the first sense transistor 650 are either an n-channel metal oxide semiconductor (NMOS) transistor (as illustrated), to include an nFET, or a p-channel metal oxide semiconductor (PMOS) transistor, to include a pFET.

In some embodiments, the second sensing path 669 includes a second select transistor 678 having a gate coupled with a second sense signal line 676, a drain coupled with a voltage node 662, and a source coupled with a second sense transistor 672 of the second sensing path 669. The second sense transistor 672 can have a gate that is also coupled to the sense node 640, a drain coupled with the source of the second select transistor 658, and a source coupled with ground. Thus the second sense transistor 672 is configured to be responsive to a voltage level present on the sense node 640. An output (sa_out2) of the second sensing path 669 can be taken at the source of the second sense transistor 676. The second sense signal line 676 can be configured to receive a control signal sen2 that facilitates isolating the second sense transistor 672 from the voltage node 662, which can be configured to receive a supply voltage, e.g., Vcc. In differing embodiments, the first select transistor 658 and the first sense transistor 650 are either an n-channel metal oxide semiconductor (NMOS) transistor (as illustrated), to include an nFET, or a p-channel metal oxide semiconductor (PMOS) transistor, to include a pFET.

In order to create a threshold voltage gap between the first sensing path 649 and the second sensing path 669, the first sense transistor 650 and the second sense transistor 672 in these different sensing paths can be manufactured differently (e.g., with a different Vt) or biased to a different trip point, as will be explained. The sense circuit 600 can be designed to generate a threshold voltage gap to between 150 and 220 millivolts (mV), for example, between the two sensing paths. In one embodiment, the threshold voltage gap is 180 mV, provided by way of example (see FIG. 7B).

More specifically, in one embodiment, the first sense transistor 650 can have a first threshold voltage (Vt) and the second sense transistor 676 can have a second threshold voltage 684 (e.g., Vt2) that differs from the first threshold voltage by a threshold voltage gap, e.g., Vt+Vt(gap). As this is an optional embodiment, Vt2 illustrated as second threshold voltage 684 is encircled with a dashed line. If the second sense transistor 672 is an NMOS transistor, for example, an n-channel of the second sense transistor 672 includes a different n-type implant dose than an n-channel of the first sense transistor 650, the different n-type implant dose to provide the threshold voltage gap. Further, if the second sense transistor 672 is a PMOS transistor, for example, a p-channel of the second transistor comprises a different p-type implant dose than a p-channel of the first transistor, the different p-type implant dose to provide the threshold voltage gap.

In another embodiment, each of the first sense transistor 650 and the second sense transistor 672 has the same threshold voltage (e.g., the same Vgs values within manufacturing tolerances), and the second sensing path further includes a voltage source 682 coupled with a source of the second sense transistor 672 to change a trip point of the second sense transistor 672 by the threshold voltage gap. For example, where the source of the first sense transistor 650 is coupled with (or connected to) ground, the source of the second sense transistor 672 is coupled with (or connected to) the voltage source 682, where the voltage source 682 is coupled with the ground. In one embodiment, the voltage source 682 is a source-ground regulator coupled between the source of the second sense transistor 672 and ground to variably regulate the voltage bias, and thus the trip point, at the source of the second transistor.

In various embodiments, a sense circuit output line (e.g., sa_out1 and sa_out2) can be connected to additional circuitry (not illustrated) of the memory device 130 configured to respond to the sense circuit 600 as part of a sensing operation. For example, the sense circuit 600 can be a component of the data register 121 of FIG. 1B and its output sa_out1 and sa_out2 can be provided as an input to the cache register 118 for output of the sensed data state from the memory device 130. The output signal sa_out1 on an output line can include a signal generated by a latch (e.g., a latch circuit that is not illustrated) which is representative of a logic level, such as a logic 'high' (e.g., represented by Vcc) or logic 'low' (e.g., represented by Vss) level indicative of a sensed data state of a selected memory cell of NAND string 206, for example.

During a pre-charge portion of a sense operation, the gate of pre-charge transistor 644 can be biased by a voltage level (e.g., of control signal blpre) on signal line 642 to pre-charge the sense node 640 by injecting a pre-charge current into the sense node 640. An additional voltage level (e.g., of control signal blclamp) can be applied to signal line 666 to activate transistor 668 (e.g., nFET), and a further voltage level (e.g., of control signal tc_iso) can be applied to signal line 670 to activate transistor 652 (e.g., nFET). Activating transistors 644, 652, and 668 can serve to connect the data line 204 to the voltage node 646, thereby pre-charging the sense node 640 and the data line 204.

Following the pre-charging of the sense node 640 and the data line 204, a second portion of the sense operation can be performed to detect whether or not the pre-charged data line 204 and sense node 640 is discharged during the sense operation, thereby determining the data state of the memory cell selected for sensing. Because the sense circuit 600 employs two different sensing paths 649 and 669, a single sense operation can be performed to detect two different states of the memory cells, e.g., with reference to the first threshold voltage and the different second threshold voltage, or with reference to the same threshold voltages but employing a different trip point of the second sense transistor 672.

In some embodiments, following the pre-charging of the sense node 640 and the data line 204, the sense node 640 can be isolated from the data line 204, such as by deactivating the transistor 668 and/or deactivating the transistor 652. The data line 204 can then be selectively connected to the source 216 depending upon whether the memory cell selected for sensing is activated or deactivated in response to a sense voltage applied to its control gate. After the data line 204 is given an opportunity to discharge, if current is flowing through the NAND string 206, the sense node 640 can again be connected to the data line 204 by activating the transistors 652 and 668.

In various embodiments, if a voltage level of the data line 204 is lower than the pre-charge voltage level due to current flow through the NAND string 206, the voltage level of the sense node 640 will likewise experience a drop. If the voltage level of the data line 204 remains at the pre-charge voltage level, such as when the memory cell selected for sensing remains deactivated, the voltage level of the sense node 640 can remain at its pre-charge (or boosted) voltage level. With the transistors 658 and 678 activated, and the voltage level of the sense node 640 applied to the control gate of the first and second sense transistors 650 and 672, the voltage nodes 660 and 662 can be selectively connected to the sense outputs sa_out1 and sa_out2 depending on a voltage level of the sense node 640. As discussed, a latch may also be coupled with each of these sense outputs of the sense circuit 600 in order to keep track of and provide an output for the sensing of the voltage level of the sense node 640 with reference the trip points of the first and second sense transistors 650 and 672. In one embodiment, each of the sense outputs sa_out1 and sa_out2 are coupled to the same latch and the sen1 and sen2 signals are toggled one at a time in order to create a histogram, which will be discussed in more detail. In another embodiment, a set of latches are employed, one latch to hold sa_out1 and another latch to hold sa_out2, in which the toggling is unnecessary and the two states associated with the two sensing paths can be concurrently stored.

Various embodiments can utilize boosting and deboosting of the sense node 640 during the sense operation. Boosting (e.g., capacitively coupling a first boost voltage level to) and deboosting (e.g., capacitively coupling a second, lower, boost voltage level to) the sense node 640 can be used, for example, to facilitate a higher develop overhead. By boosting the sense node 640 prior to the sense node develop time, the voltage level of the sense node 640 can be allowed to develop longer without prematurely indicating current flow of the data line 204. Subsequent deboosting of the sense node 640 after isolation from the NAND string 206 from the data line 204 can permit the voltage level of the sense node 640 to drop below the trip point (e.g., threshold voltage) of the first and second sense transistors 650 and 672 to indicate that current flow (e.g., a threshold level of current flow) was detected. In sequential sensing performed by the sense circuit 600 during one or more sensing operations, the boost voltage can be provided to the voltage node 654 (e.g., to the capacitor 648) using the multiple boost regulators 680A . . . 680D. The multiple boost regulators 680A . . . 680D can also be multiplexed to additional sense circuits in order to perform parallel sensing operations across multiple memory cells.

In some embodiments, data lines corresponding to activated memory cells having threshold voltages nearer the sense voltage applied to their control gates are expected to experience lower levels of discharge and higher resulting voltage levels of the sense node 640 than data lines corresponding to activated memory cells having threshold voltages farther from the sense voltage applied to their control gates. Accordingly, sense nodes 640 indicating activation of their corresponding memory cell at one boost voltage level during deboosting can indicate deactivation of their corresponding memory cell at a different (e.g., higher) boost voltage level during deboosting. This phenomena can be used to compensate for a sense voltage that is higher or lower than the local minima between two adjacent threshold voltage distributions. Various embodiments utilize multiple boost voltage levels coupled to a sense node during a single sensing operation to estimate the conditions that can indicate activation of those memory cells having threshold voltages below that local minima, and can indicate deactivation of those memory cells having threshold voltages above that local minima, e.g., estimating the location of that local minima.

The trip points of the two sensing paths 649 and 669 of the sense circuit 600 can generally be dependent upon the threshold voltage of the first and second sense transistors 650 and 672, respectively. The sense circuit 600 can be configured to have trip points (e.g., sense threshold levels) close to the pre-charge voltage level that can be established on the sense node 640 prior to sensing the selected memory cell. The trip points can be particular voltage levels on the sense node 640 where the first sensing path 649 outputs a first logic level indicative of a first state of the sense node 640, e.g., when the voltage level of the sense node 640 is equal to or above the first trip point, and the second sending path 669 outputs a second logic level indicative of a second state of the sense node 640, e.g., when the voltage level of the sense node 640 is equal to or above the second trip point. The sense circuit 600 can output a third logic level indicative of a third state of the sense node 640, e.g., when the voltage level of the sense node 640 is below the trip point of the first sense transistor 650, for example. The sense circuit 600 can output a fourth logic level indicative of a fourth state of the sense node 640, e.g., when the voltage level of the sense node 640 is below the trip point of the second sense transistor 672, for example. The sensed states of the sense node 640 can be used to provide an indication of the data state of the sensed memory cell, to include providing histogram data to the local media controller 135.

Figure 7A:
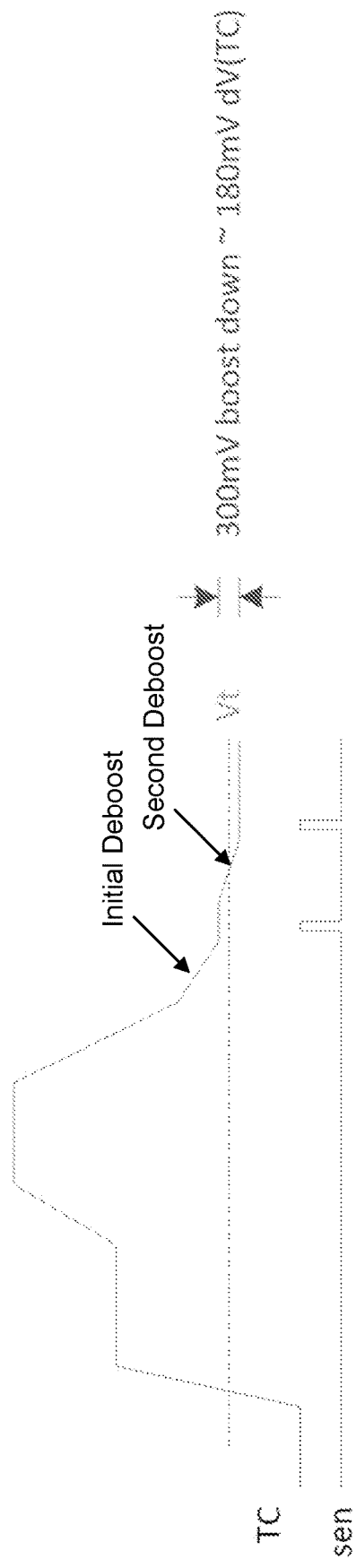
FIG. 7A is a graph illustrating timing of obtaining histogram data from two different voltage boosts applied to a sense node during a sensing operation of a single-path sense circuit according to an embodiment.

FIG. 7A is a graph illustrating timing of obtaining histogram data from two different voltage boosts applied to the sense node 640 (FIG. 6) during a sensing operation of a single-path sense circuit according to an embodiment. Such a single-path sense circuit, for example, would only include the first sensing path 649. In such an embodiment, a deboosting of the voltage at the sense node 640 a first time can provide an initial deboost to the sense node 640, bringing the sense node voltage to close (but higher) than the threshold voltage (Vt) of the first sense transistor 650. Further deboosting of the voltage at the sense node 640 a second time can provide a second deboost to close (but below) the threshold voltage, Vt. Sensing of a data state can be performed at each boost voltage level of the sense node 640. As discussed, the need to deboost two times to provide histogram data at both deboosted levels causes significant read delays.

Figure 7B:
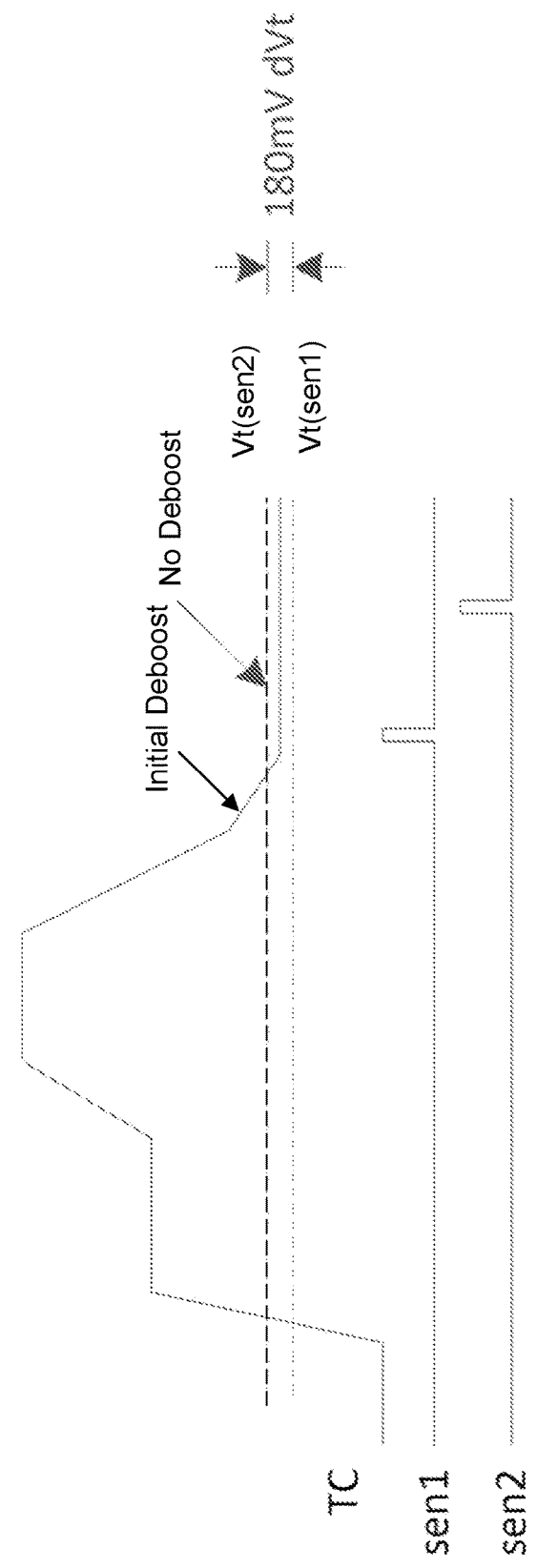
FIG. 7B is a graph illustrating timing of boosting the sense node to an initial voltage level followed by determining two different states of the sense node using two different sensing paths according to an embodiment.

FIG. 7B is a graph illustrating timing of boosting the sense node to an initial voltage level followed by determining two different states of the sense node using two different sensing paths according to an embodiment. As in the graph of FIG. 7A, a boost regulator can provide an initial deboost to the sense node 640 to bring the sense node 640 to an initial voltage level. In one embodiment, the initial voltage level is a difference between the threshold voltage of the first sense transistor 650 and a gate-source voltage drop (Vgs) of the first sense transistor 650. No further deboost need to be performed in this embodiment by performing sensing of the sense node 640 via both the second sensing path 669 (e.g., Vt in response to sen2) and the first sensing path 649 (e.g., Vt in response to sen1). Significant delay can be eliminated by not performing the second deboost, for example.

FIG. 8A is a graph illustrating a set of histograms 802 obtained from five equidistant boost voltages applied to a sense node of a single-path sense circuit according to an embodiment. The histograms 802 illustrated in FIG. 8A, therefore, correspond to those obtained via the sensing performed as per FIG. 7A.

FIG. 8B is a graph illustrating a set of histograms 805 obtained from four different boost voltages using two different sensing paths of a sense circuit where a sense voltage gap is smaller than a threshold voltage gap according to an embodiment. FIG. 8C is a graph illustrating a set of histograms 810 obtained from four different boost voltages using two different sensing paths of a sense circuit where a sense voltage gap is larger than a threshold voltage gap according to an embodiment. In other words, the threshold voltages of the first and second sense transistors 650 and 672 (FIG. 6) can be fixed, but provide a threshold voltage gap to each boost voltage level applied to the sense node 640. Thus, a fifth boost to the sense node 640 can be eliminated.

In some embodiments, the sense voltage gap is actually lower than the threshold voltage gap provided by the second sensing path 669, causing narrower histograms (FIG. 8B) than those generated in FIG. 8A. In other embodiments, the sense voltage gap is actually greater than the threshold voltage gap provided by the second sensing path, causing wider histograms (FIG. 8C) than those generated in FIG. 8A. Although the edges of these histograms may not be perfectly aligned, the local media controller 135 can still analyze the set of histograms 805 or 810 to determine, without a close approximation, where the local minima is between the adjacent threshold voltage distributions. In some embodiments, the local media controller 135 can perform, as part of analyzing the histograms, an extrapolation of either of the set of histograms 805 or the set of histograms 810 to fill in any histograms gaps or remove overlapping histograms, respectively.

Figure 9:
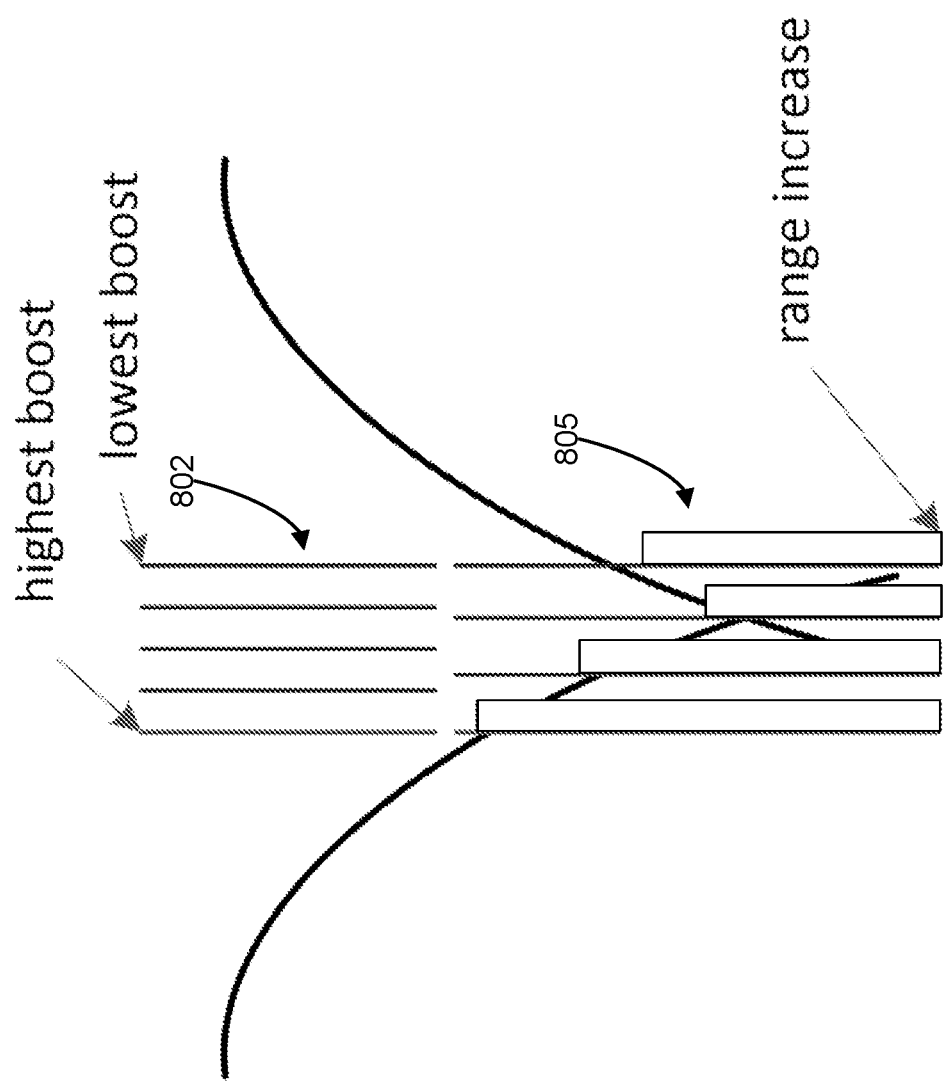
FIG. 9 is graph illustrating the set of histograms of FIG. 8B being compared to the boost voltages of FIG. 8A.

FIG. 9 is graph illustrating the set of histograms 805 of FIG. 8B being compared to the boost voltages of FIG. 8A. The graph of FIG. 9 thus illustrates a wider voltage range (or voltage range increase) from the four boost levels of the proposed dual-sensing path design of the sense circuit 600 compared to the single-path sense circuit design that employs the five equidistant boost voltages illustrated in FIG. 8A.

Figure 10:
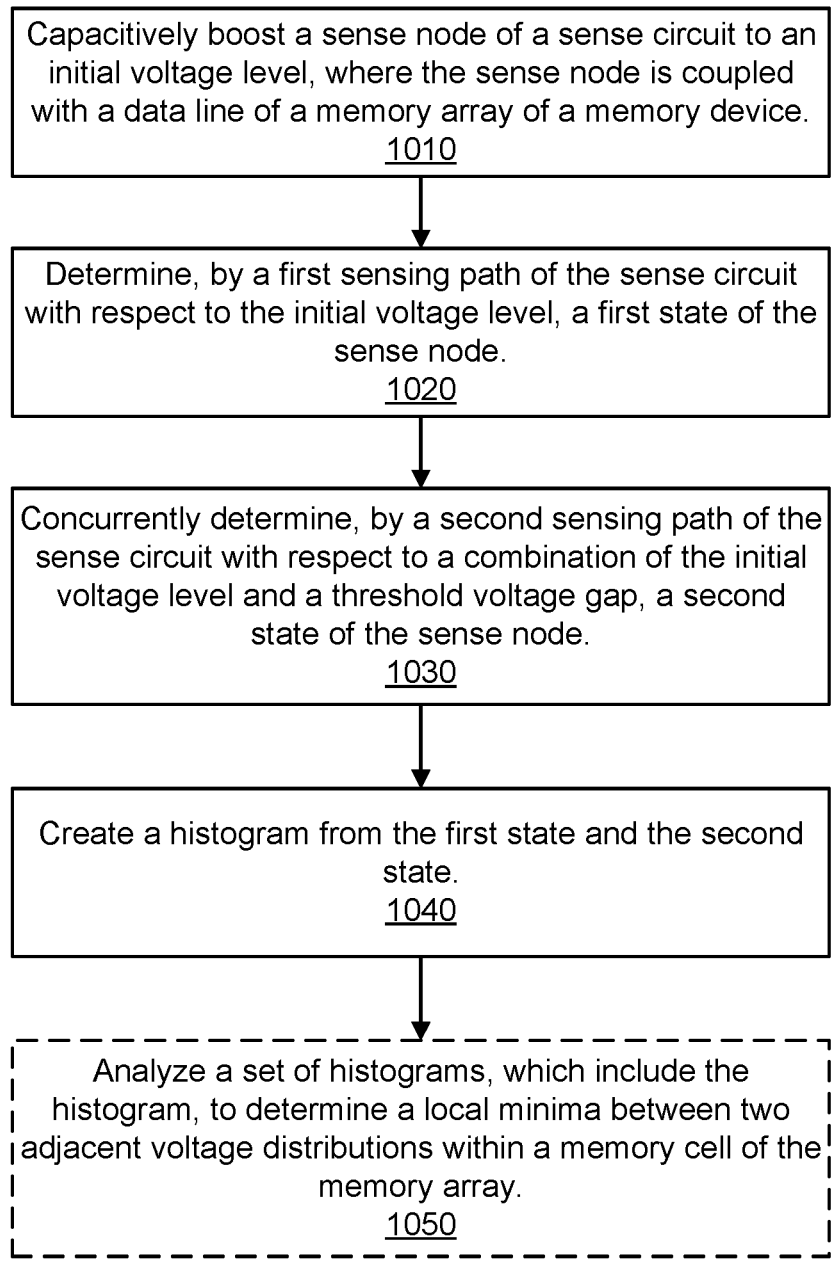
FIG. 10 is a flow diagram of an example method of employing a sense circuit having two sensing paths to concurrently sense two states of a memory cell according to some embodiments.

FIG. 10 is a flow diagram of an example method 1000 of employing a sense circuit having two sensing paths to concurrently sense two states of a memory cell according to some embodiments. For example, the method 1000 can employ the sense circuit 600 in addition to the processing logic of the local media controller 135 for creating and processing histograms (e.g., histograms 802 or 805). In some embodiments, a boost regulator (e.g., boost regulator 680) is located within or outside of the sense circuit 600.

At operation 1010, a node is boosted. For example, one or more boost regulator can be selected to boost the sense node 640. More specifically, a sense node of the sense circuit is capacitively boosted to an initial voltage level, where the sense node is coupled with a data line of a memory array of a memory device. The sense circuit 600 can include the sense node 640 and be located within either or both of the cache register 118 and the data register 121. The memory array can be the memory array 104 of the memory device 130 illustrated in FIG. 1B, for example.

At operation 1020, a first state of a node is determined. For example, the sense circuit 600 can determine a first state of the sense node. More specifically, the sense circuit 600 uses a first sensing path with respect to the initial voltage level to determine a first state of the sense node 640. The first sensing path can be the first sensing path 649 of the sense circuit 600 of FIG. 6.

At operation 1030, a second state of a node is determined. For example, the sense circuit 600 can concurrently determine a second state of the sense node. More specifically, the sense circuit 600 uses a second sensing path to concurrently determine a second state of the sense node 640 with respect to a combination of the initial voltage level and a threshold voltage gap provided by the second sensing path 669.

At operation 1040, a representation of data is created. For example, the processing logic, such as the local media controller 135, can create a histogram, or other representation of data, from the first state and the second state. This histogram can be one of the individual histograms illustrated in FIG. 8A or FIG. 8B.

At operation 1050, data is analyzed. For example, the processing logic, such as the local media controller 135, can optionally analyze a set of histograms, which include the histogram, to determine a local minima between two adjacent threshold voltage distributions within a memory cell of the memory array. The sense circuit 600 can then use the voltage level associated with the local minima as a boost voltage level for reading data out of the memory cell, e.g., distinguishing between two logical states of the adjacent threshold voltage distributions.

In some embodiments, a selective slow program convergence (SSPC) can be performed when programming memory cells, e.g., where a rate of programming is used until reaching a first program verify level, after which the rate of programming is slowed until reaching a second program verify level. This SSPC approach to cell programming can be employed to reach a threshold voltage level that is targeted within a memory cell at a slower rate to protect against the risk of over-programming the memory cell with voltage. The disclosed embodiments can thus work as a way to more quickly perform a program verify of the threshold voltage levels during SSPC programming, e.g., verify that the memory cell has indeed reached the first program verify level and the second program verify level during these separate phases of SSPC.

Figure 11:
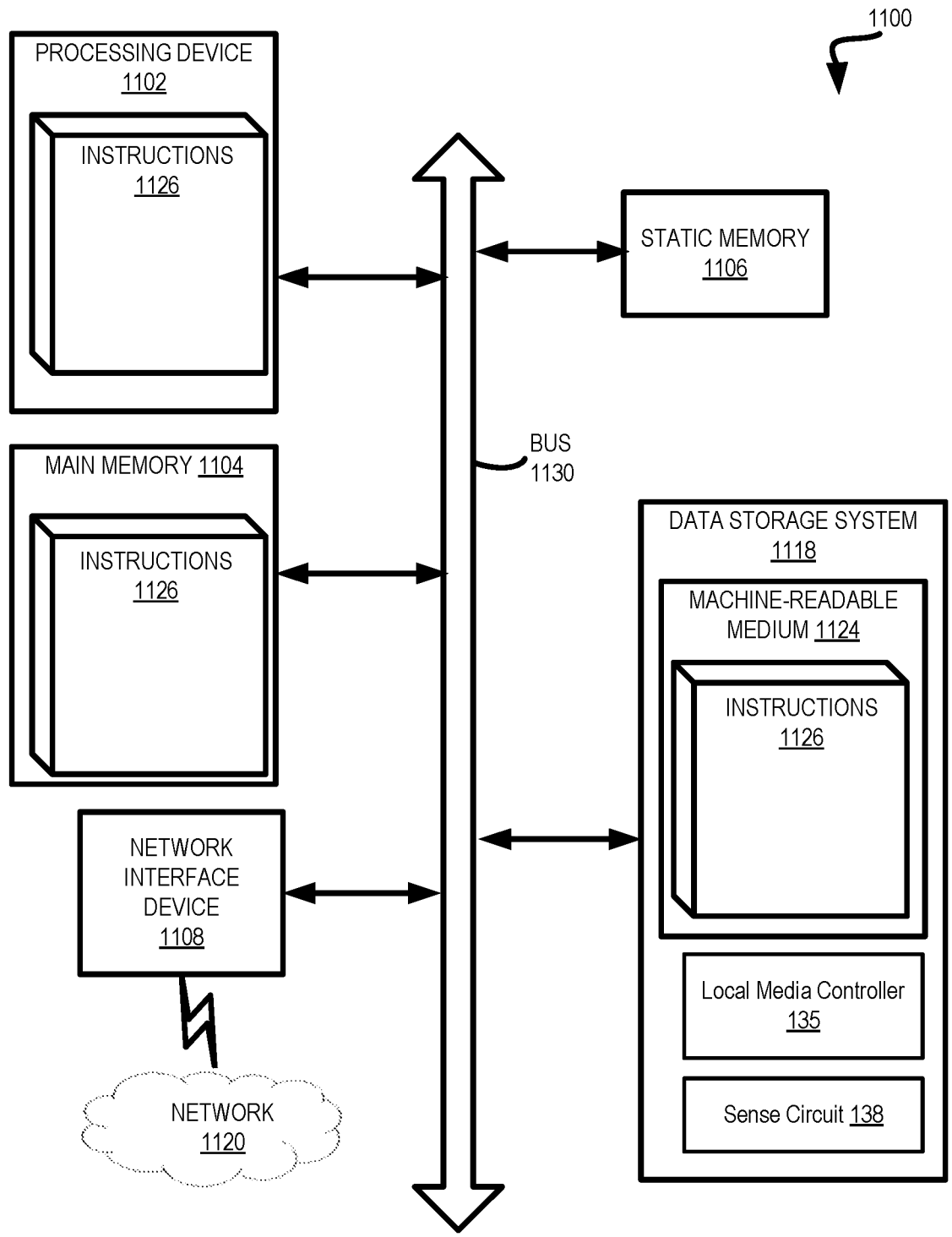
FIG. 11 is a block diagram of an example computer system in which embodiments of the present disclosure can operate.

FIG. 11 illustrates an example machine of a computer system 1100 within which a set of instructions, for causing the machine to perform any one or more of the methodologies discussed herein, can be executed. In some embodiments, the computer system 1100 can correspond to a host system (e.g., the host system 120 of FIG. 1A) that includes, is coupled to, or utilizes a memory sub-system (e.g., the memory sub-system 110 of FIG. 1A) or can be used to perform the operations of a controller (e.g., to execute an operating system to perform operations corresponding to the memory sub-system controller 115 of FIG. 1A). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 1100 includes a processing device 1102, a main memory 1104 (e.g., read-only memory (ROM), flash memory, dynamic random access memory (DRAM) such as synchronous DRAM (SDRAM) or Rambus DRAM (RDRAM), etc.), a static memory 1110 (e.g., flash memory, static random access memory (SRAM), etc.), and a data storage system 1118, which communicate with each other via a bus 1130.

Processing device 1102 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 1102 can also be one or more special-purpose processing devices such as an application specific integrated circuit (ASIC), a field programmable gate array (FPGA), a digital signal processor (DSP), network processor, or the like. The processing device 1102 is configured to execute instructions 1128 for performing the operations and steps discussed herein. The computer system 1100 can further include a network interface device 1112 to communicate over the network 1120.

The data storage system 1118 can include a machine-readable storage medium 1124 (also known as a computer-readable medium) on which is stored one or more sets of instructions 1128 or software embodying any one or more of the methodologies or functions described herein. The data storage system 1118 can further include the local media controller 135 and the sense circuit 138 or sense circuit 600 that were previously discussed. The instructions 1128 can also reside, completely or at least partially, within the main memory 1104 and/or within the processing device 1102 during execution thereof by the computer system 1100, the main memory 1104 and the processing device 1102 also constituting machine-readable storage media. The machine-readable storage medium 1124, data storage system 1118, and/or main memory 1104 can correspond to the memory sub-system 110 of FIG. 1A.

In one embodiment, the instructions 1126 include instructions to implement functionality corresponding to a controller (e.g., the memory sub-system controller 115 of FIG. 1A). While the machine-readable storage medium 1124 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A device comprising:
a memory array; and
a sense circuit coupled with the memory array, wherein the sense circuit comprises:
a sense node coupled with a data line of the memory array;
a first sensing path comprising a first transistor having a first gate coupled with the sense node, the first transistor having a first threshold voltage; and
a second sensing path comprising a second transistor having a second gate coupled with the sense node, wherein a first threshold voltage of the first transistors differs from a second threshold voltage of the second transistor by a threshold voltage gap.

2. The device of claim 1, wherein a source of each of the first transistor and the second transistor is coupled with ground.

3. The device of claim 1, wherein each of the first transistor and the second transistor is an n-channel metal oxide semiconductor (NMOS) transistor.

4. The device of claim 3, wherein an n-channel of the second transistor comprises a different n-type implant dose than an n-channel of the first transistor, the different n-type implant dose to provide the threshold voltage gap.

5. The device of claim 1, wherein the threshold voltage gap is between 150 and 220 millivolts.

6. The device of claim 1, wherein each of the first transistor and the second transistor is a p-channel metal oxide semiconductor (PMOS) transistor.

7. The device of claim 6, wherein a p-channel of the second transistor comprises a different p-type implant dose than a p-channel of the first transistor, the different p-type implant dose to provide the threshold voltage gap.

8. The device of claim 1, further comprising a boost regulator and a capacitor coupled between the boost regulator and the sense node, wherein:
the boost regulator is to apply a voltage boost to charge the capacitor to an initial voltage level;
the first sensing path is to determine a first state of the sense node of the memory array with respect to the initial voltage level;
the second sensing path is to concurrently determine a second state of the sense node with respect to a combination of the initial voltage level and the threshold voltage gap; and
the sense circuit is to create a histogram from the first state and the second state.

9. The device of claim 8, wherein the initial voltage level comprises a difference between the first threshold voltage and a gate-source voltage drop of the first transistor.

10. A device comprising:
a memory array; and
a sense circuit coupled with the memory array, wherein the sense circuit comprises:
a sense node coupled with a data line of the memory array;
a first sensing path comprising a first transistor having a first gate coupled with the sense node, the first transistor defined by an inner threshold voltage;
a second sensing path comprising a second transistor having a second gate coupled with the sense node, the second transistor defined by the inner threshold voltage; and
a voltage source coupled with a source of the second transistor to change a trip point of the second transistor by a threshold voltage gap.

11. The device of claim 10, wherein a source of the first transistor is coupled with ground and the voltage source is coupled between the source of the second transistor and the ground.

12. The device of claim 10, wherein each of the first transistor and the second transistor is an n-channel metal oxide semiconductor (NMOS) transistor.

13. The device of claim 10, wherein the voltage source is between 150 and 220 millivolts.

14. The device of claim 10, wherein each of the first transistor and the second transistor is a p-channel metal oxide semiconductor (PMOS) transistor.

15. The device of claim 10, further comprising a boost regulator and a capacitor coupled between the boost regulator and the sense node, wherein:
the boost regulator is to apply a voltage boost to charge the capacitor to an initial voltage level;
the first sensing path is to determine a first state of the sense node of the memory array with respect to the initial voltage level;
the second sensing path is to concurrently determine a second state of the sense node with respect to a combination of the initial voltage level and the threshold voltage gap; and
the sense circuit is to create a histogram from the first state and the second state.

16. The device of claim 15, wherein the initial voltage level comprises a difference between the threshold voltage and a gate-source voltage drop of the first transistor.

17. A method comprising:
capacitively boosting a sense node of a sense circuit to an initial voltage level, wherein the sense node is coupled with a data line of a memory array of a memory device;
determining, by a first sensing path of the sense circuit with respect to the initial voltage level, a first state of the sense node;

concurrently determining, by a second sensing path of the sense circuit with respect to a combination of the initial voltage level and a threshold voltage gap, a second state of the sense node; and creating a histogram from the first state and the second state.

18. The method of claim 17, further comprising analyzing a set of histograms, which comprise the histogram, to determine a local minima between two adjacent threshold voltage distributions within a memory cell of the memory array.

19. The method of claim 17, further comprising:
employing a first transistor in the first sensing path; and
employing a second transistor in the second sensing path, wherein a first threshold voltage of the first transistor differs from a second threshold voltage of the second transistor by the threshold voltage gap.

20. The method of claim 17, further comprising:
employing a first transistor in the first sensing path, the first transistor having a threshold voltage;
employing a second transistor in the second sensing path, the second transistor having a threshold voltage; and
employing a voltage source coupled with a source of the second transistor to provide a different trip point of the second transistor compared to the first transistor, the different trip point corresponding to the threshold voltage gap.

* * * * *

UNITED STATES PATENT AND TRADEMARK OFFICE
CERTIFICATE OF CORRECTION

PATENT NO. : 11,557,351 B2
APPLICATION NO. : 17/234240
DATED : January 17, 2023
INVENTOR(S) : Luyen Tien Vu et al.

It is certified that error appears in the above-identified patent and that said Letters Patent is hereby corrected as shown below:

In the Claims

In Claim 1, Column 23, Line 43-44, delete "transistors" and insert --transistor--

Signed and Sealed this
Twenty-eighth Day of February, 2023

Katherine Kelly Vidal
*Director of the United States Patent and Trademark Office*